US012635300B2

(12) United States Patent
Jeon et al.

(10) Patent No.: US 12,635,300 B2
(45) Date of Patent: May 19, 2026

(54) DISPLAY DEVICE AND METHOD FOR MANUFACTURING THE SAME

(71) Applicant: Samsung Display Co., LTD., Yongin-si (KR)

(72) Inventors: Hyung Il Jeon, Seoul (KR); Sung Kook Park, Suwon-si (KR); Ki Seong Seo, Seoul (KR); So Yeon Yoon, Uijeongbu-si (KR); Joo Woan Cho, Seongnam-si (KR); Jin Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 874 days.

(21) Appl. No.: 17/571,296

(22) Filed: Jan. 7, 2022

(65) Prior Publication Data

US 2022/0352421 A1 Nov. 3, 2022

(30) Foreign Application Priority Data

Apr. 30, 2021 (KR) ........................ 10-2021-0056722

(51) Int. Cl.
*H10H 20/831* (2025.01)
*H10H 20/01* (2025.01)
*H10H 20/857* (2025.01)

(52) U.S. Cl.
CPC ........ *H10H 20/8312* (2025.01); *H10H 20/01* (2025.01); *H10H 20/857* (2025.01); *H10H 20/032* (2025.01); *H10H 20/0364* (2025.01)

(58) Field of Classification Search
CPC ... H01L 25/0753; H01L 33/44; H01L 33/382; H01L 33/62; H01L 33/005;
(Continued)

(56) References Cited

U.S. PATENT DOCUMENTS

| | | | |
|---|---|---|---|
| 8,450,737 B2 | 5/2013 | Choi et al. | |
| 10,332,949 B2* | 6/2019 | Takeya | H10K 50/805 |

(Continued)

FOREIGN PATENT DOCUMENTS

| | | |
|---|---|---|
| KR | 2011-0041251 A | 4/2011 |
| KR | 20200009375 A | 1/2020 |

(Continued)

OTHER PUBLICATIONS

Chen, Po-Hsun, et al. "Effects of plasma treatment time on surface characteristics of indium-tin-oxide film for resistive switching storage applications." Applied Surface Science 414 (2017): 224-229. (Year: 2017).*

(Continued)

*Primary Examiner* — Jacob Y Choi
*Assistant Examiner* — Aaron Michael Wegner
(74) *Attorney, Agent, or Firm* — Womble Bond Dickinson (US) LLP

(57) ABSTRACT

There is provided a display device including a base substrate, a conductive connection layer on the base substrate, a partitioning wall on the conductive connection layer, and a light emitting element on the conductive connection layer and in a space surrounded by the partitioning wall in a plan view, wherein the conductive connection layer includes a first portion overlapping the partitioning wall and the light emitting element, and a second portion not overlapping the partitioning wall and the light emitting element, an electrical conductivity of the first portion being greater than an electrical conductivity of the second portion.

18 Claims, 22 Drawing Sheets

(58) Field of Classification Search
CPC ..... H01L 2933/0016; H01L 2933/0066; H01L 33/385; H10H 29/30; H10H 29/012; H10H 29/32; H10H 29/34; H10H 29/39; H10H 29/49; H10H 29/37
See application file for complete search history.

(56) References Cited

U.S. PATENT DOCUMENTS

| | | | |
|---|---|---|---|
| 11,060,689 B2 | 7/2021 | Kwon et al. | |
| 11,592,155 B2 | 2/2023 | Kwon et al. | |
| 2014/0183501 A1* | 7/2014 | Kim ..................... | H10K 59/122 438/34 |
| 2017/0069609 A1 | 3/2017 | Zhang et al. | |
| 2017/0358624 A1* | 12/2017 | Takeya .................... | H01L 33/42 |
| 2018/0012949 A1 | 1/2018 | Takeya et al. | |
| 2018/0090058 A1* | 3/2018 | Chen ........................ | G09G 3/32 |
| 2018/0308420 A1 | 10/2018 | Shin et al. | |
| 2020/0025351 A1* | 1/2020 | Kwon .................. | H01L 33/507 |
| 2021/0305457 A1* | 9/2021 | Goshonoo .............. | H01L 33/42 |
| 2024/0258294 A1* | 8/2024 | Xu .......................... | H01L 33/62 |

FOREIGN PATENT DOCUMENTS

| | | |
|---|---|---|
| KR | 2020-0022575 A | 3/2020 |
| KR | 10-2022-0070141 A | 5/2022 |

OTHER PUBLICATIONS

Korean Office Action for KR Application No. 10-2021-0056722, dated Jan. 21, 2025, 8 pages.

Michael Honle et al., "Mechanism of indium tin oxide//indium tin oxide direct wafer bonding," Thin Solid Films, Mar. 19, 2020, pp. 1-7, 704, El Sevier.

Po-Hsun Chen et al., "Resistance Switching Characteristics Induced by $O_2$ Plasma Treatment of an Indium Tin Oxide Film for Use as an Insulator in Resistive Random-Access Memory," Applied Materials and Interfaces, Jan. 10, 2017, pp. 3149-3155, vol. 9, American Chemical Society.

Po-Hsun Chen et al., "Effects of plasma treatment time on surface characteristics of indium-tin-oxide film for resistive switching storage applications," Applied Surface Science, Apr. 7, 2017, pp. 224-229, vol. 414, El Sevier.

* cited by examiner

FIG. 15

DISPLAY DEVICE AND METHOD FOR MANUFACTURING THE SAME

CROSS-REFERENCE TO RELATED APPLICATION

This application claims priority to, and the benefit of, Korean Patent Application No. 10-2021-0056722 filed on Apr. 30, 2021, in the Korean Intellectual Property Office (KIPO), the entire content of which is incorporated by reference herein.

BACKGROUND

1. Field

The present disclosure relates to a display device, and a method for manufacturing the display device.

2. Description of Related Art

As information society develops, demand for a display device for displaying an image is increasing in various forms. The display device may include a planarized panel display device, such as a liquid crystal display device, a field emission display device, or a light-emitting display device. The light-emitting display device may include an organic light-emitting display device including an organic light-emitting diode element as a light emitting element, an inorganic light-emitting display device including an inorganic semiconductor element as a light emitting element, or may have an ultra-small light-emitting diode or a micro light-emitting diode element as a light emitting element.

Recently, a head mounted display (HMD) including the light emitting display device is being developed. The head mounted display is a spectacle-type monitor device for virtual reality (VR) or augmented reality (AR) which is worn in a form of glasses or a helmet, and has a focal point at a position relatively close to a user's eyes.

A high-resolution ultra-small light-emitting diode display panel including an ultra-small light-emitting diode element is applied to the head mounted display. The ultra-small light-emitting diode display panel may include a semiconductor circuit board, a light emitting element layer, and a conductive connection layer located between the semiconductor circuit board and the light emitting element layer.

SUMMARY

Aspects of some embodiments of the present disclosure provide a display panel that does not require etching of a conductive connection layer.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a display device including a base substrate, a conductive connection layer on the base substrate, a partitioning wall on the conductive connection layer, and a light emitting element on the conductive connection layer and in a space surrounded by the partitioning wall in a plan view, wherein the conductive connection layer includes a first portion overlapping the partitioning wall and the light emitting element, and a second portion not overlapping the partitioning wall and the light emitting element, an electrical conductivity of the first portion being greater than an electrical conductivity of the second portion.

The display device may further include a pixel electrode between the base substrate and the light emitting element, and overlapping the first portion of the conductive connection layer, and a common electrode on the light emitting element and the conductive connection layer, and overlapping the first portion and the second portion of the conductive connection layer, wherein the light emitting element is between the pixel electrode and the common electrode.

The common electrode may be in direct contact with the second portion of the conductive connection layer.

The common electrode may be in direct contact with a side of the partitioning wall.

The first portion of the conductive connection layer overlapping the light emitting element may be surrounded by the second portion of the conductive connection layer in a plan view.

The second portion of the conductive connection layer may be surrounded by the first portion of the conductive connection layer overlapping the partitioning wall.

The first portion of the conductive connection layer may include mutually-spaced first portions respectively overlapping light emitting elements, wherein the second portion of the conductive connection layer includes mutually-spaced second portions, and wherein the first portion of the conductive connection layer overlapping partitioning walls is continuous.

The conductive connection layer may include indium tin oxide (ITO).

An oxygen content of the first portion of the conductive connection layer may be lower than an oxygen content of the second portion of the conductive connection layer.

A surface roughness of the first portion of the conductive connection layer may be greater than a surface roughness of the second portion of the conductive connection layer.

The light emitting element and the partitioning wall may be made of a same material.

The first portion of the conductive connection layer may be conductive, while the second portion of the conductive connection layer is non-conductive.

The display device may further include a wavelength conversion layer on the light emitting element, and filling a space surrounded by the partitioning wall.

According to some embodiments of the present disclosure, there is provided a display device including a base substrate, a conductive connection layer on the base substrate, and including a first portion, and a second portion surrounding the first portion in a plan view, and having an electrical resistance that is higher than the first portion, and a light emitting element on the first portion of the conductive connection layer.

The display device may further include a pixel electrode between the base substrate and the light emitting element, and overlapping the first portion of the conductive connection layer, and a common electrode on the light emitting element and the conductive connection layer, and overlapping the first portion and the second portion of the conductive connection layer, wherein the light emitting element is between the pixel electrode and the common electrode.

The common electrode may be in direct contact with the second portion of the conductive connection layer.

The conductive connection layer may include indium tin oxide (ITO).

An oxygen content of the first portion of the conductive connection layer may be lower than an oxygen content of the second portion of the conductive connection layer.

A surface roughness of the first portion of the conductive connection layer may be greater than a surface roughness of the second portion of the conductive connection layer.

According to some embodiments of the present disclosure, there is provided a method of manufacturing a display device, the method including providing a base substrate, forming a conductive connection layer on the base substrate, forming a light emitting element on the conductive connection layer, and treating the conductive connection layer using oxygen plasma such that the conductive connection layer is divided into a first portion, and a second portion having a lower electrical conductivity than the first portion, the first portion overlapping the light emitting element, and the second portion not overlapping the light emitting element.

According to the aforementioned and other embodiments of the present disclosure, etching of the conductive connection layer of the display panel is unnecessary, thereby suppressing or preventing defects caused by byproducts resulting from the etching of the display panel, and suppressing or preventing reduction in a thickness of the partitioning wall which may be otherwise caused by the etching.

BRIEF DESCRIPTION OF THE DRAWINGS

The above and other embodiments and aspects of the present disclosure will become more apparent by describing embodiments thereof with reference to the attached drawings, in which:

FIG. 7 to FIG. 17 are cross-sectional views for illustrating a manufacturing method of a display device according to some embodiments;

DETAILED DESCRIPTION

Figure 1:
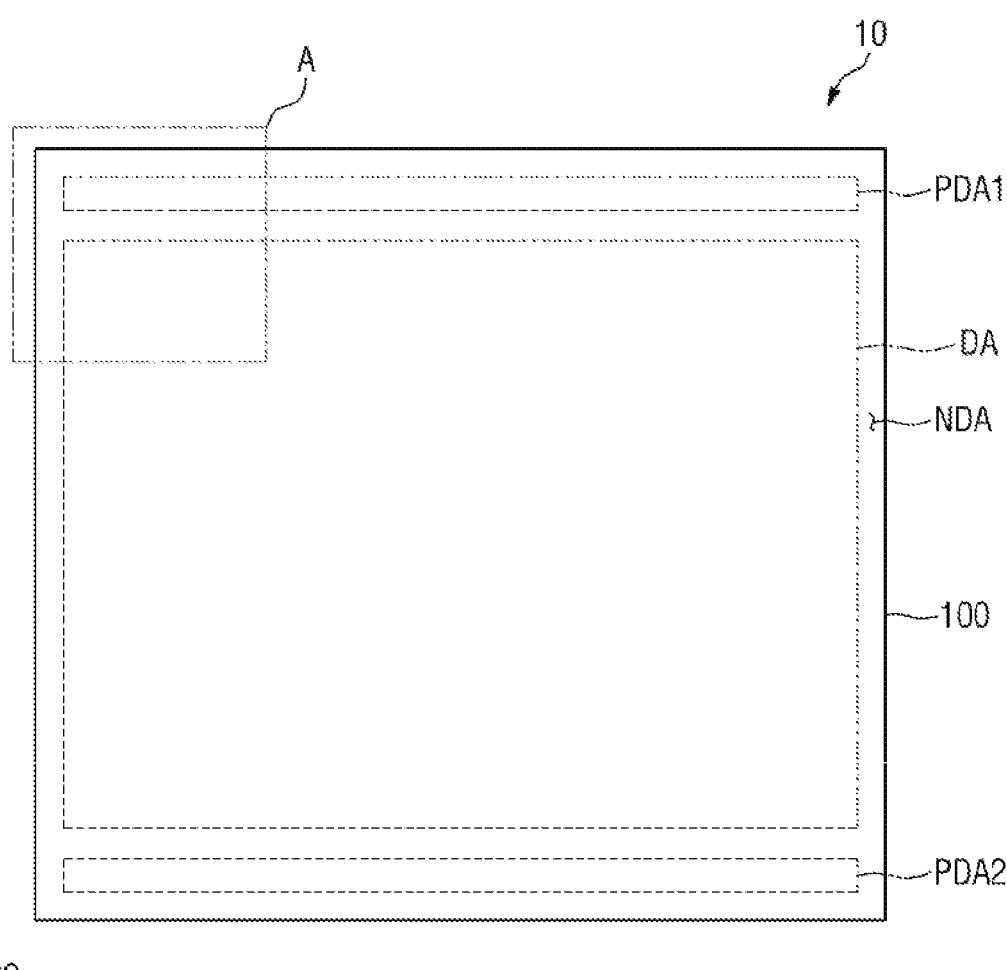
FIG. 1 is a plan view of a display device according to some embodiments.
Figure 1:
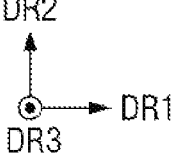

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof.

Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within $\pm 30\%$, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
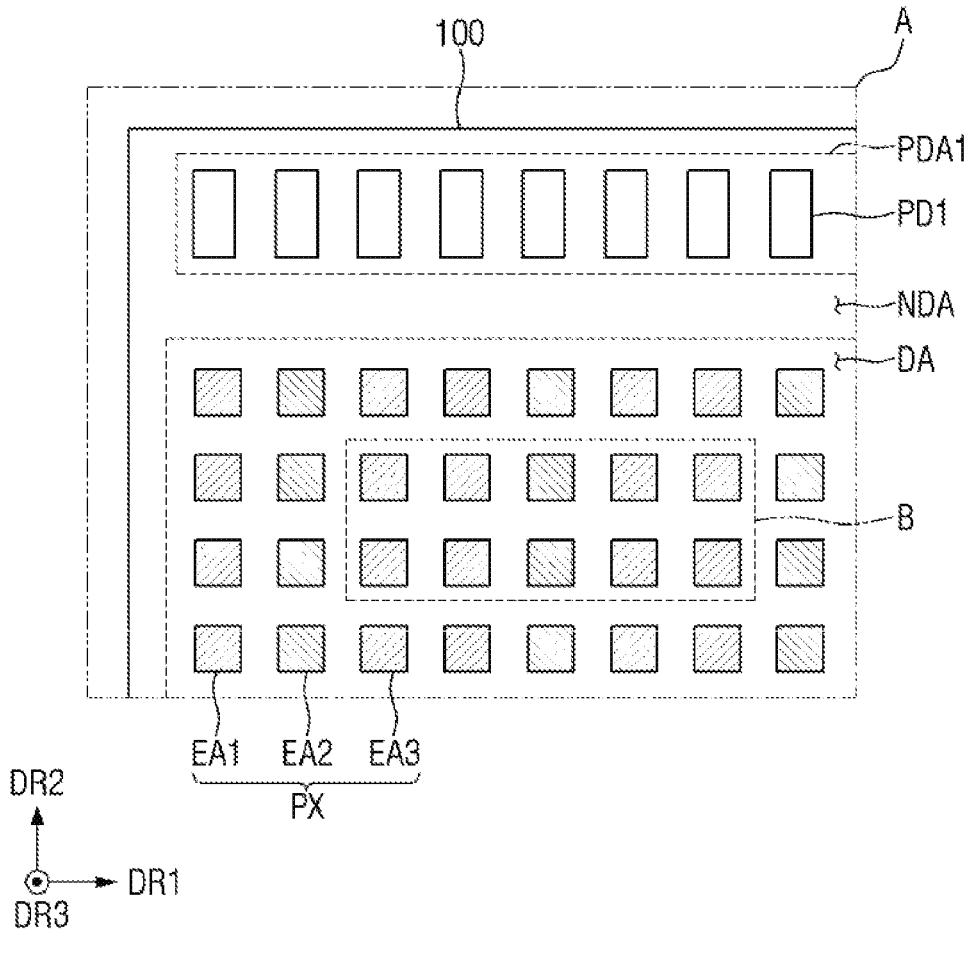
FIG. 2 is a detailed enlarged view showing area A of FIG. 1.
Figure 3:
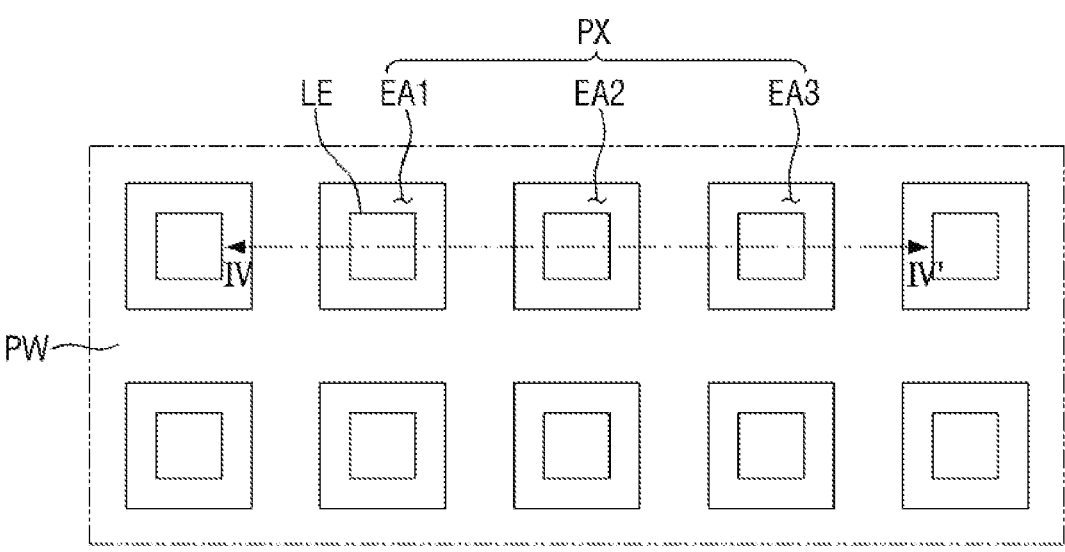
FIG. 3 is an enlarged view of an area B of FIG. 2.
Figure 3:
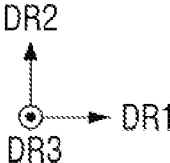

FIG. 1 is a plan view of a display device according to some embodiments. FIG. 2 is a detailed enlarged view showing an area A of FIG. 1. FIG. 3 is an enlarged view of an area B of FIG. 2.

In FIG. 1 to FIG. 3, a first direction DR1 indicates a longitudinal or horizontal direction of a display panel 100, a second direction DR2 indicates a transverse or vertical direction of the display panel 100, and a third direction DR3 indicates a thickness direction of the display panel 100 or a thickness direction of a semiconductor circuit board 110. In this case, "left," "right," "upper," and "lower" indicate directions of the display panel 100 in a plan view. For example, "right" indicates one side in the first direction DR1, "left" indicates the opposite side in the first direction DR1, "upper" indicates one side in the second direction DR2, and "lower" indicates the opposite side in the second direction DR2. Further, "top" refers to one side in the third direction DR3, and "bottom" refers to the opposite side in the third direction DR3.

Referring to FIG. 1 to FIG. 3, a display device 10 may refer to any electronic device that provides a display screen. For example, the display device 10 may include not only portable electronic devices, such as mobile phones, smart phones, tablet PCs (personal computers), electronic watches, smart watches, watch phones, mobile communication terminals, electronic notebooks, e-books, PMPs (portable multimedia players), navigation devices, game consoles, and digital cameras that provide a display screen, but also televisions, laptops, monitors, billboards, Internet of Things, head mounted displays, and vehicle display devices that provide a display screen. A type of the display device 10 to which a technical idea of the present disclosure may be applied is not limited thereto.

The display device 10 according to some embodiments may have a substantially rectangular shape in a plan view. The display device 10 may have a rectangular shape having right corners in a plan view. However, the present disclosure is not limited thereto. The display device 10 may have a rectangular shape having rounded corners in a plan view.

Hereinafter, an example in which the display device 10 is embodied as an ultra-small light-emitting diode display device (or a micro light-emitting diode display device) including an ultra-small light-emitting diode (or a micro light-emitting diode) as a light emitting element will be described. The present disclosure is not limited thereto.

Hereinafter, an example in which the display device 10 has a LEDoS (Light Emitting Diode on Silicon) structure in which light-emitting diode elements are located on a semiconductor circuit board 110 (see FIG. 4) formed using a semiconductor process will be described. The present disclosure is not limited thereto.

The display device 10 may include a display panel 100. The display panel 100 may have a rectangular planar shape having a long side in the first direction DR1 and a short side in the second direction DR2 in a plan view. However, the planar shape of the display panel 100 is not limited to, but may have a polygonal shape other than the rectangular shape, or a circular, oval, or irregular planar shape.

The display panel 100 may include a display area DA in which an image is displayed, and a non-display area NDA in which an image is not displayed. A planar shape of the display area DA may correspond to the planar shape of the display panel 100. The planar shape of the display area DA may include a rectangular shape. The present disclosure is not limited thereto. The display area DA may be located in an inner area of the display panel 100. The non-display area NDA may be located around the display area DA. The non-display area NDA may be located to surround display area DA.

As shown in FIG. 2, a plurality of pixels PX may be located in the display area DA. A pixel PX may be defined as a minimum light-emitting unit capable of displaying light (e.g., white light). Each of the plurality of pixels PX may include a plurality of light-emitting areas EA1, EA2, and EA3 for emitting light. In some embodiments of the present disclosure, it is illustrated that each of the plurality of pixels PX includes three light-emitting areas EA1, EA2, and EA3. The present disclosure is not limited thereto. For example, each of the plurality of pixels PX may include four light-emitting areas.

Each of the plurality of light-emitting areas EA1, EA2, and EA3 may include a light emitting element LE for emitting first light. The light emitting element LE has been illustrated to have a rectangular planar shape. However, the present disclosure is not limited thereto. For example, the light emitting element LE may have a polygonal planar shape other than the rectangular shape, and may have a circular planar shape, an oval planar shape, or an irregular planar shape.

Each of the first light-emitting areas EA1 emits the first light. Each of the first light-emitting areas EA1 may output the first light output from the light emitting element LE as it is. The first light may be light of a blue wavelength band.

The blue wavelength band may be in a range of about 370 nm to about 460 nm. The present disclosure is not limited thereto.

Each of the second light-emitting areas EA2 emits second light. Each of the second light-emitting areas EA2 may convert a portion of the first light output from the light emitting element LE into the second light, and may output the second light. The second light may be light of a green wavelength band. The green wavelength band may be in a range of about 480 nm to about 560 nm. The present disclosure is not limited thereto.

Each of the third light-emitting areas EA3 emits third light. Each of the third light-emitting areas EA3 may convert a portion of the first light output from the light emitting element LE into the third light, and may output the same. The third light may be light of a red wavelength band. The red wavelength band may be in a range of about 600 nm to about 750 nm. The present disclosure is not limited thereto.

The first light-emitting areas EA1, the second light-emitting areas EA2, and the third light-emitting areas EA3 may be alternately and repeatedly arranged with each other along the first direction DR1. For example, the first light-emitting area EA1, the second light-emitting area EA2, and the third light-emitting area EA3 may be arranged in that order in first direction DR1.

The first light-emitting areas EA1 may be arranged in the second direction DR2. The second light-emitting areas EA2 may be arranged in the second direction DR2. The third light-emitting areas EA3 may be arranged in the second direction DR2.

As shown in FIG. 3, a plurality of light-emitting areas EA1, EA2, and EA3 may be spaced from each other via a partitioning wall PW. The partitioning wall PW may be located to surround the light emitting element LE. The partitioning wall PW may be spaced away from the light emitting element LE. The partitioning wall PW may have a mesh planar shape, a net planar shape, or a grid planar shape. Each of a plurality of light-emitting areas EA1, EA2, and EA3 may be partitioned by the partitioning wall PW. Although the drawing shows that each of the plurality of light-emitting areas EA1, EA2, and EA3 has a rectangular planar shape, the present disclosure is not limited thereto. For example, each of the plurality of light-emitting areas EA1, EA2, and EA3 may have a polygonal shape other than the rectangular shape, or a circular shape, an oval shape, or an irregular shape.

As shown in FIGS. 1 and 2, the non-display area NDA may include a first pad area PDA1 and a second pad area PDA2. The first pad area PDA1 may be located in an upper area of the display panel 100. The first pad area PDA1 may include first pads PD1 connected to an external circuit board. The second pad area PDA2 may be located in a lower side of the display panel 100. The second pad area PDA2 may include second pads connected to an external circuit board. The second pad area PDA2 may be omitted in some embodiments.

Figure 4:
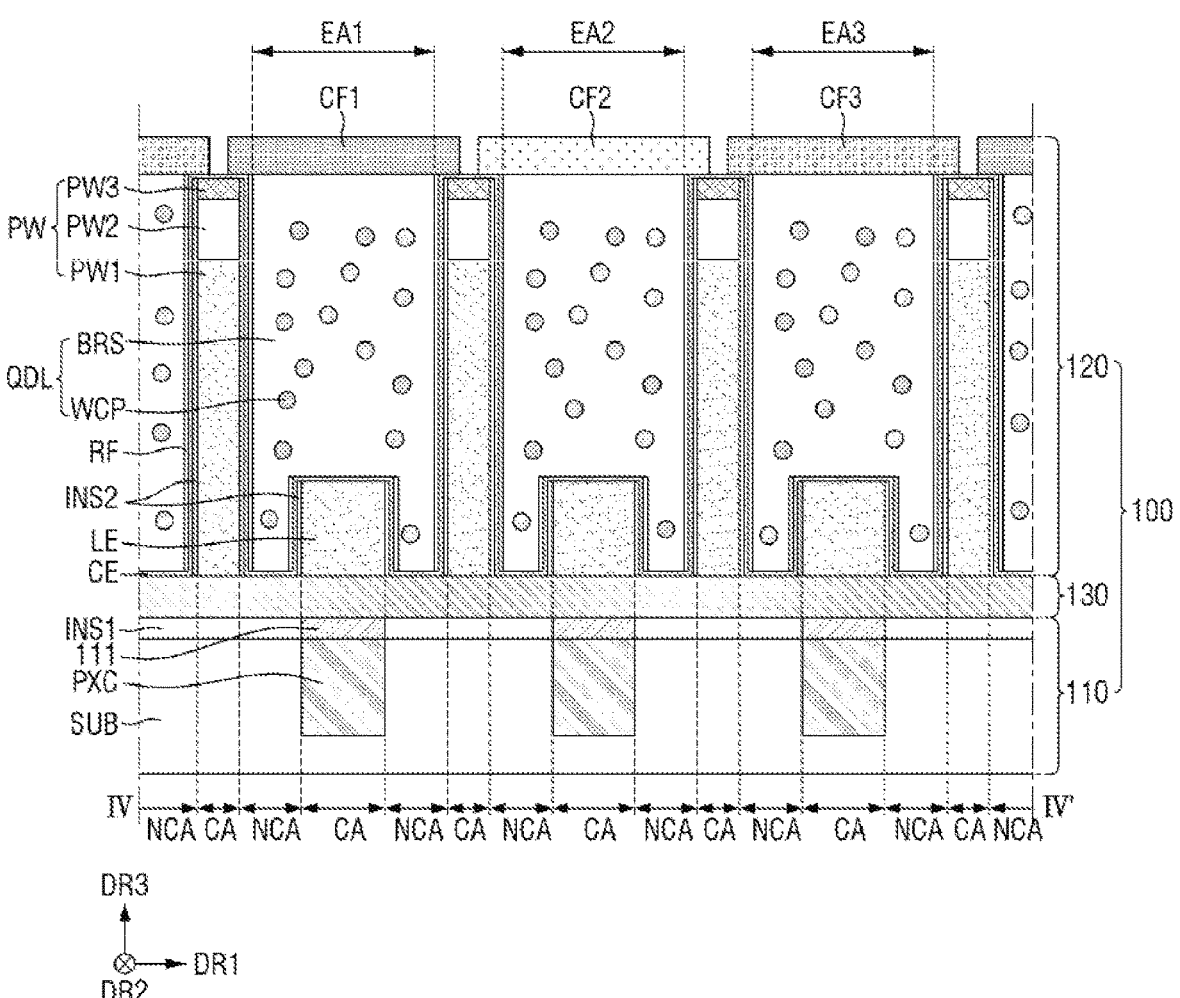
FIG. 4 is a cross-sectional view taken along the line IV-IV' in FIG. 3.
Figure 5:
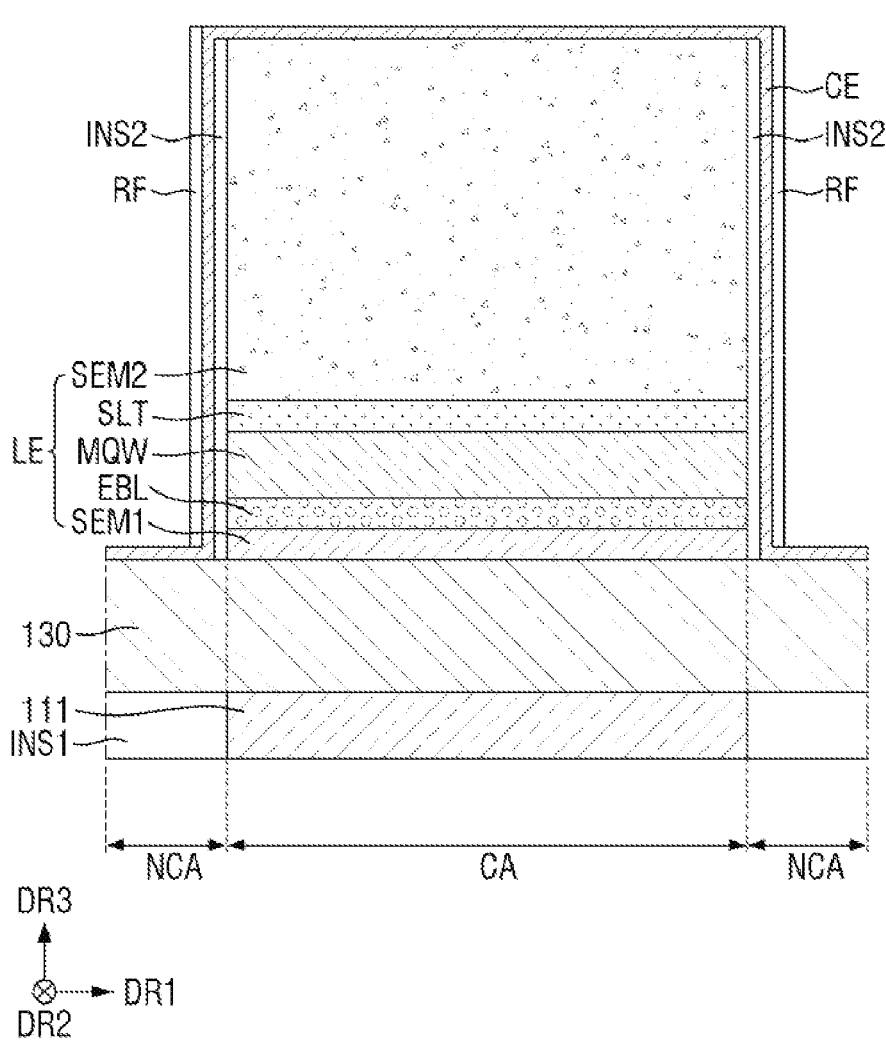
FIG. 5 is a detailed enlarged cross-sectional view showing one example of a light emitting element of FIG. 4.
Figure 6:
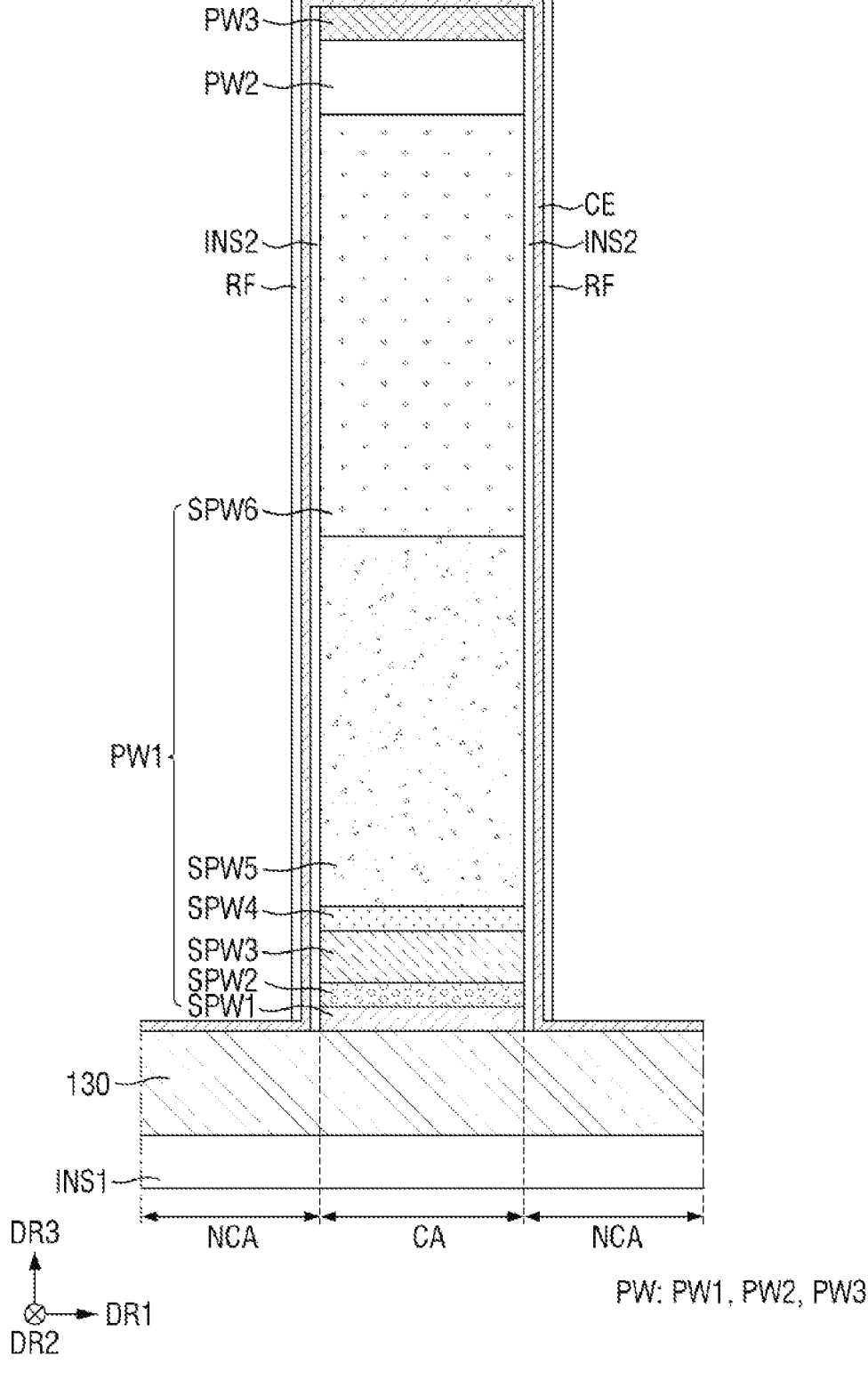
FIG. 6 is a detailed enlarged cross-sectional view showing one example of a partitioning wall of FIG. 4.

FIG. 4 is a cross-sectional view taken along the line IV-IV' in FIG. 3. FIG. 5 is a detailed enlarged cross-sectional view showing one example of a light emitting element of FIG. 4. FIG. 6 is a detailed enlarged cross-sectional view showing one example of a partitioning wall of FIG. 4.

Referring to FIG. 4 to FIG. 6, the display panel 100 may include the semiconductor circuit board 110, a light emitting element layer 120, and a conductive connection layer 130 located between the semiconductor circuit board 110 and the light emitting element layer 120.

The semiconductor circuit board 110 may include a base substrate SUB, a plurality of pixel circuits PXC, a plurality of pixel electrodes 111, and a first insulating film INS1.

The base substrate SUB may be embodied as a silicon wafer substrate produced using a semiconductor process. The base substrate SUB may support other components located thereon.

The plurality of pixel circuits PXC may be produced using a semiconductor process. The plurality of pixel circuits PXC may be located in a display area DA. The pixel circuits PXC may be embedded within the base substrate SUB, but may not protrude outwardly from the base substrate SUB. The present disclosure is not limited thereto. Each of the plurality of pixel circuits PXC may be connected to a corresponding pixel electrode 111. That is, the plurality of pixel circuits PXC and the plurality of pixel electrodes 111 may be connected to each other in a one-to-one corresponding manner. Each of the plurality of pixel circuits PXC may overlap the light emitting element LE in the third direction DR3.

Each of the plurality of pixel circuits PXC may include at least one transistor formed using a semiconductor process. Further, each of the plurality of pixel circuits PXC may further include at least one capacitor formed using a semiconductor process. Each of the plurality of pixel circuits PXC may apply a pixel voltage or an anode voltage to each pixel electrode 111.

Each of the pixel electrodes 111 may be located on a corresponding pixel circuit PXC. Each of the pixel electrodes 111 may act as an exposed portion of each pixel circuit PXC. That is, each of the pixel electrodes 111 may protrude from a top face of the pixel circuit PXC and outwardly of the substrate SUB (e.g., may extend at a region above the substrate SUB). Each of the pixel electrodes 111 may be integrally formed with the pixel circuit PXC. Each of the pixel electrodes 111 may receive a pixel voltage or an anode voltage from each pixel circuit PXC. Each of the pixel electrodes 111 may be made of aluminum (Al).

The first insulating film INS1 may be located on the base substrate SUB. The first insulating film INS1 might not overlap the pixel circuit PXC or the pixel electrode 111. The first insulating film INS1 may be located on the base substrate SUB and in an area where the pixel electrode 111 is not located. The pixel electrode 111 may be located over an entirety of the area where the pixel electrode 111 is not located. A top face of the first insulating film INS1 and a top face of the pixel electrode 111 may be substantially coplanar with each other. The first insulating film INS1 may be embodied as an inorganic film such as a silicon oxide film (SiO$_2$ film), an aluminum oxide film (Al$_2$O$_3$ film), or a hafnium oxide film (HfOx film).

The conductive connection layer 130 may be located on the pixel electrode 111 and the first insulating film INS1, and may be located over an entire area of the base substrate SUB. The conductive connection layer 130 may be in contact with, and may be electrically connected to, each of the pixel electrode 111, a common electrode CE, and the light emitting element LE, which are located in different areas. The pixel electrode 111 and the light emitting element LE may be electrically connected to each other via the conductive connection layer 130.

The conductive connection layer 130 may include a first portion CA and a second portion NCA having different electrical conductivities. The first portion CA may have an electrical conductivity that is higher than that of the second portion NCA. The first portion CA may have an electrical resistance that is lower than that of the second portion NCA.

The second portion NCA may have an electrical resistance of several MO (megaohms) or greater. The first portion CA may be a conductive area, while the second portion NCA may be a substantially non-conductive area. Hereinafter, the first portion is referred to as a conductive area CA, and the second portion is referred to as a non-conductive area NCA.

The conductive area CA may overlap the light emitting element LE and the partitioning wall PW in the thickness direction (third direction DR3). Further, the conductive area CA may overlap the pixel electrode 111. The conductive area CA may be in direct contact with the pixel electrode 111, the light emitting element LE, and the first partitioning wall PW1 of the partitioning wall PW. The pixel electrode 111 and the light emitting element LE may be electrically connected to each other via the conductive area CA of the conductive connection layer 130. A plurality of conductive areas CA may be provided. In this case, the plurality of conductive areas CA may be separated and spaced apart from each other. A conductive area CA may include a shape of an island in a plan view. Adjacent conductive areas CA may be separated and spaced from each other via the non-conductive area NCA. Adjacent ones of the plurality of conductive areas CA may be electrically insulated from each other via the non-conductive area NCA.

The non-conductive area NCA might not overlap the light emitting element LE and the partitioning wall PW. The non-conductive area NCA may be in direct contact with the common electrode CE. Even when the non-conductive area NCA contacts the common electrode CE, the common electrode CE and the conductive area CA may be electrically insulated from each other because the non-conductive area NCA has low electrical conductivity. The non-conductive area NCA may surround each of the plurality of conductive areas CA in a plan view. The non-conductive area NCA may surround one or more of the light emitting elements LE in the plan view. A plurality of non-conductive areas NCA may be provided. In this case, adjacent ones of the plurality of non-conductive areas NCA may be separated and spaced from each other via the conductive area CA.

The non-conductive area NCA may be surrounded by the conductive area CA. In other words, in a plan view, the non-conductive area NCA may surround the conductive area CA overlapping the light emitting element LE, and may be surrounded by the conductive area CA overlapping the partitioning wall PW. In the plan view, the conductive area CA overlapping the light emitting element LE may be located in an area surrounded by the non-conductive area NCA, while the non-conductive area NCA, along with the conductive area CA overlapping the light emitting element LE, may be located in an area surrounded by the conductive area CA overlapping the partitioning wall PW. In this case, the conductive areas respectively CA overlapping the partitioning walls PW may be formed integrally with each other, that is, to be continuous over an entire area. The present disclosure is not limited thereto.

The conductive connection layer 130 may include a material whose electrical conductivity changes depending on a content of oxygen (O) therein. The conductive connection layer 130 may include a material whose electrical conductivity decreases as the content of oxygen (O) increases. For example, the conductive connection layer 130 may include ITO (Indium Tin Oxide). However, the present disclosure is not limited thereto. The conductive connection layer 130 may include indium oxide (InOx). Herein, an example in which the conductive connection layer 130 includes at least one of ITO (Indium Tin Oxide) or indium oxide (InOx) is described. The present disclosure is not limited thereto. The conductive connection layer 130 may include at least one selected from materials whose electrical conductivities vary depending on the content of oxygen (O).

The oxygen content of the conductive area CA may be lower than that of the non-conductive area NCA. As will be described later, the non-conductive area NCA may have the oxygen content that is higher than that of the conductive area CA due to oxygen plasma ($O_2$ plasma). For example, the oxygen content of the conductive area CA may be in a range of about 40 at % (atomic percent) inclusive to about 47 at % exclusive, while the oxygen content of the non-conductive area NCA may be in a range of about 47 at % inclusive to about 55 at % exclusive. The present disclosure is not limited thereto. The oxygen content may be obtained via analysis using X-ray photoelectron spectroscopy (XPS). The present disclosure is not limited thereto.

A surface roughness of the conductive area CA may be greater than a surface roughness of the non-conductive area NCA. The surface roughness of the conductive area CA may be in a range of about 0.9 nm to about 0.85 nm, or may be about 0.864 nm. The present disclosure is not limited thereto. The surface roughness of the non-conductive area NCA may be in a range of about 0.85 nm to about 0.70 nm, and may be about 0.821 nm, or about 0.805 nm. The present disclosure is not limited thereto. The surface roughness may be measured via AFM (atomic force microscopy) analysis. The present disclosure is not limited thereto. Further, the measured surface roughness value may be an RMS (root mean square) value.

When the conductive connection layer 130 includes ITO (Indium Tin Oxide), a thickness of the conductive connection layer 130 may be, for example, in a range of about 50 nm to about 300 nm, or in a range of about 100 nm to about 200 nm, or may be about 150 nm. The present disclosure is not limited thereto. As will be described later, when the conductive connection layer 130 includes ITO (Indium Tin Oxide), a first sub-substrate SB1 (FIG. 7) and a second sub-substrate SB2 (FIG. 7) spaced from each other may be bonded to each other via the conductive connection layer 130, and the thickness of the conductive connection layer 130 may be within the above defined range. Therefore, when the conductive connection layer 130 includes ITO (Indium Tin Oxide), a thickness of display device 10 (see FIG. 1) may become thinner, and thus a weight of the display device 10 (see FIG. 1) may be reduced.

The conductive connection layer 130 may have the electrical conductivity varying depending on the oxygen content. Thus, a separate etching process of the conductive connection layer 130 might not be necessary. Accordingly, a top face of the conductive connection layer 130 may be free of a step, such that another component may be formed more easily on the top face of the conductive connection layer 130. Otherwise, when the conductive connection layer 130 is etched, byproducts may remain after the etching, or a thickness of the partitioning wall PW may decrease in the process of etching the conductive connection layer 130. However, adjusting the oxygen content of the conductive connection layer 130 to control the electrical conductivity based on the areas thereof may allow the etching of the conductive connection layer 130 to be unnecessary, such that occurrence of the above-described defects may be suppressed or prevented.

The light emitting element layer 120 may be located on the conductive connection layer 130. The light emitting element layer 120 may include the light emitting elements LE, the partitioning wall PW, a second insulating film INS2, the common electrode CE, a reflective film RF, a protective film PTF, a wavelength conversion layer QDL, and a plurality of color filters CF1, CF2, and CF3.

The light emitting element layer 120 may include the first light-emitting area EA1, the second light-emitting area EA2, and the third light-emitting area EA3 partitioned from each other via the partitioning wall PW. Each of the first light-emitting area EA1, the second light-emitting area EA2, and the third light-emitting area EA3 may include the light emitting element LE, the wavelength conversion layer QDL, and the plurality of color filters CF1, CF2, CF3.

The light emitting element LE may be located on the conductive connection layer 130 and in each of the first light-emitting area EA1, the second light-emitting area EA2, and the third light-emitting area EA3. The light emitting element LE may be a vertical type light-emitting diode element extending in the third direction DR3. That is, a length in the third direction DR3 of the light emitting element LE may be larger than a length in a horizontal direction thereof.

The light emitting element LE may be embodied as a micro light-emitting diode element. The light emitting element LE may include a first semiconductor layer SEMI, an electron blocking layer EBL, an active layer MQW, a superlattice layer SLT, and a second semiconductor layer SEM2, which are arranged in the third direction DR3. The first semiconductor layer SEMI, the electron blocking layer EBL, the active layer MQW, the superlattice layer SLT, and the second semiconductor layer SEM2 may be sequentially stacked in the third direction DR3.

The first semiconductor layer SEMI may be located on the conductive connection layer 130. The first semiconductor layer SEMI may be doped with a first conductivity type dopant, such as Mg, Zn, Ca, Se, or Ba. For example, the first semiconductor layer 31 may be made of p-GaN doped with p-type Mg.

The electron blocking layer EBL may be located on the first semiconductor layer SEMI. The electron blocking layer EBL may function to inhibit, reduce, or prevent excessive electrons from flowing into the active layer MQW. For example, the electron blocking layer EBL may be made of p-AlGaN doped with p-type Mg. The electron blocking layer EBL may be omitted in some embodiments.

The active layer MQW may be located on the electron blocking layer EBL. The active layer MQW may emit light via electron-hole combination under an electric signal applied through the first semiconductor layer SEMI and the second semiconductor layer SEM2. The active layer MQW may emit first light having a central wavelength band in a range of about 450 nm to about 495 nm, that is, light of a blue wavelength band.

The active layer MQW may include a material having a single or multi quantum well structure. When the active layer MQW includes a material having a multi-quantum well structure, a plurality of well layers and a plurality of barrier layers may be alternately stacked one on top of another. In this connection, the well layer may be made of InGaN, and the barrier layer may be made of GaN or AlGaN. The present disclosure is not limited thereto.

Alternatively, the active layer MQW may have a structure in which a semiconductor material having a large bandgap energy, and a semiconductor material having a small bandgap energy, are alternately stacked one on top of another. The active layer MQW may include groups III to V semiconductor materials depending on a wavelength band of light emitting therefrom. The light emitting from the active layer MQW is not limited to the first light (having blue wavelength band). In some cases, the light emitting from the active layer MQW may be second light (having a green wavelength band) or third light (having a red wavelength band).

The superlattice layer SLT may be located on the active layer MQW. The superlattice layer SLT may function to relieve stress between the second semiconductor layer SEM2 and the active layer MQW. For example, the superlattice layer SLT may be made of InGaN or GaN. The superlattice layer SLT may be omitted in some embodiments.

The second semiconductor layer SEM2 may be located on the superlattice layer SLT. The second semiconductor layer SEM2 may be doped with a second conductivity type dopant, such as Si, Ge, or Sn. For example, the second semiconductor layer 32 may be made of n-GaN doped with n-type Si.

The partitioning wall PW may be located on the conductive connection layer 130. The partitioning wall PW may be spaced apart from the light emitting element LE located in each of the first light-emitting area EA1, the second light-emitting area EA2, and the third light-emitting area EA3. The partitioning wall PW may be located to surround the light emitting element LE located in each of the first light-emitting area EA1, the second light-emitting area EA2, and the third light-emitting area EA3 in a plan view.

The partitioning wall PW may include a first partitioning wall PW1, a second partitioning wall PW2, and a third partitioning wall PW3.

The first partitioning wall PW1 may be formed using the same process that may be used to form the light emitting element LE. The present disclosure is not limited thereto. In this case, at least a partial area of the first partitioning wall PW1 may include the same material as that of the light emitting element LE. The first partitioning wall PW1 may include a plurality of sub-partitioning walls SPW1 to SPW6 sequentially stacked in the third direction DR3. For example, the first partitioning wall PW1 may include a first sub-partitioning wall SPW1, a second sub-partitioning wall SPW2, a third sub-partitioning wall SPW3, a fourth sub-partitioning wall SPW4, a fifth sub-partitioning wall SPWS, and a sixth sub-partitioning wall SPW6.

The first sub-partitioning wall SPW1 may be made of the same material as that of the first semiconductor layer SEMI of the light emitting element LE. The first sub-partitioning wall SPW1 may be formed using the same process that may be used to form the first semiconductor layer SEMI of the light emitting element LE.

The second sub-partitioning wall SPW2 may be made of the same material as that of the electron blocking layer EBL of the light emitting element LE. The second sub-partitioning wall SPW2 may be formed using the same process that may be used to form the electron blocking layer EBL of the light emitting element LE. In some embodiments, when the electron blocking layer EBL is omitted, the second sub-partitioning wall SPW2 may also be omitted.

The third sub-partitioning wall SPW3 may be made of the same material as that of the active layer MQW of the light emitting element LE. The third sub-partitioning wall SPW3 may be formed using the same process that may be used to form the active layer MQW of the light emitting element LE.

The fourth sub-partitioning wall SPW4 may be made of the same material as that of the superlattice layer SLT of the light emitting element LE. The fourth sub-partitioning wall SPW4 may be formed using the same process that may be used to form the superlattice layer SLT of the light emitting element LE.

The fifth sub-partitioning wall SPW5 may be made of the same material as that of the second semiconductor layer SEM2 of the light emitting element LE. The fifth sub-partitioning wall SPW5 may be formed using the same process that may be used to form the second semiconductor layer SEM2 of the light emitting element LE. In a manufacturing process of the display panel 100 of some embodiments, the fifth sub-partitioning wall SPW5 is not removed, but a portion of the second semiconductor layer SEM2 of the light emitting element LE is removed, so that a thickness of the fifth sub-partitioning wall SPW5 may be larger than a thickness of the second semiconductor layer SEM2 of the light emitting element LE.

The sixth sub-partitioning wall SPW6 may be made of a semiconductor material not doped with a dopant, that is, an undoped semiconductor material. For example, the sixth sub-partitioning wall SPW6 may be made of GaN undoped with a dopant.

Each of the second partitioning wall PW2 and the third partitioning wall PW3 may serve as a mask to reduce or prevent etching of the first partitioning wall PW1 during the manufacturing process for forming the light emitting element LE and the partitioning wall PW.

The second partitioning wall PW2 may be located on the first partitioning wall PW1. The second partitioning wall PW2 may be embodied as an inorganic film, such as a silicon oxide film ($SiO_2$ film), an aluminum oxide film ($Al_2O_3$ film), or a hafnium oxide film (HfOx film).

The third partitioning wall PW3 may be located on the second partitioning wall PW2. The third partitioning wall PW3 may include a conductive material such as nickel (Ni).

The second insulating film INS2 may be located on side faces of the partitioning wall PW, and side faces of each of the light emitting elements LE. The second insulating film INS2 may be embodied as an inorganic film such as a silicon oxide film ($SiO_2$ film), an aluminum oxide film ($Al_2O_3$ film), or a hafnium oxide film (HfOx film).

The common electrode CE may be located on a top face of each of the light emitting elements LE, and on the side faces of each of the light emitting elements LE (e.g., with the second insulating film INS2 therebetween), on a top face of the partitioning wall PW, and on the side faces of the partitioning wall PW (e.g., with the second insulating film INS2 therebetween), and on the conductive connection layer 130 in the non-conductive area NCA. The common electrode CE may contact the second insulating film INS2 located on the side faces of the conductive connection layer 130, the side faces of the partitioning wall PW, the side faces of each of the pixel electrodes 111, and the side faces of each of the light emitting elements LE. Further, the common electrode CE may contact the top face of the conductive connection layer 130, the top face of each of the light emitting elements LE, and the top face of the partitioning wall PW.

The common electrode CE may be in contact with a top face of the non-conductive area NCA of the conductive connection layer 130, and the top face of the light emitting element LE that are not covered with the second insulating film INS2 and that are exposed. A common voltage may be applied to the conductive connection layer 130. Then, the common voltage supplied to the conductive connection layer 130 may be applied to the light emitting element LE. That is, one end of the light emitting element LE may receive a pixel voltage or an anode voltage of the pixel electrode 111 via the conductive connection layer 130, while the opposite end thereof may receive the common voltage or a cathode voltage via the common electrode CE. The light emitting element LE may emit light at a luminance level (e.g., at a predefined luminance level) based on a voltage difference between the pixel voltage and the common voltage.

The common electrode CE may include a transparent conductive material. The common electrode CE may be made of a transparent conductive oxide (TCO) such as ITO (Indium Tin Oxide) or IZO (Indium Zinc Oxide).

The reflective film RF reflects light beams emitted from the light emitting element LE and traveling in a lateral direction toward a top of the display panel. The reflective film RF may include a highly reflective metal material, such as aluminum (Al).

The reflective film RF may be located on the side faces of the conductive connection layer 130, the side faces of the partitioning wall PW, the side faces of each of the pixel electrodes 111, and the side faces of each of the light emitting elements LE (e.g., with the second insulating film INS2 and the common electrode CE therebetween). The reflective film RF may contact the common electrode CE located on the side faces of the conductive connection layer 130, the side faces of the partitioning wall PW, the side faces of each of the pixel electrodes 111, and the side faces of each of the light emitting elements LE.

The wavelength conversion layer QDL may be located on the common electrode CE. The wavelength conversion layer QDL may be located in each of the first light-emitting area EA1, the second light-emitting area EA2, and the third light-emitting area EA3. The wavelength conversion layer QDL may fill a space partitioned by the partitioning wall PW. The wavelength conversion layer QDL may convert a wavelength of light, which is emitted from the light emitting element LE and incident to the wavelength conversion layer QDL, to light of a different wavelength.

The wavelength conversion layer QDL may include a base resin BRS and wavelength conversion particles WCP. The base resin BRS may include a light-transmissive organic material. For example, the base resin BRS may include epoxy resin, acrylic resin, cardo resin, or imide resin. The wavelength conversion particles WCP may convert first light incident thereto from the light emitting element LE to fourth light. For example, the wavelength conversion particles WCP may convert light of a blue wavelength band into light of a yellow wavelength band. The wavelength conversion particle WCP may include a quantum dot (QD), a quantum rod, a fluorescent material, or a phosphorescent material. The quantum dot may include group IV nanocrystals, group II-VI compound nanocrystals, group III-V compound nanocrystals, group IV-VI compound nanocrystals, or a combination thereof.

The wavelength conversion layer QDL may further include scattering particles to scatter light from the light emitting element LE in random directions. In this case, the scattering particles may include metal oxide particles or organic particles.

The plurality of color filters CF1, CF2, and CF3 may be located on the wavelength conversion layer PDL and the partitioning wall PW. The plurality of color filters CF1, CF2, CF3 may include a first color filter CF1, a second color filter CF2, and a third color filter CF3.

Each of the first color filters CF1 may be located on the wavelength conversion layer QDL in a respective first light-emitting area EA1. Further, each of the first color filters CF1 may be located on the partitioning wall PW. Each of the first color filters CF1 may transmit the first light therethrough, and may absorb or block second light and third light. For example, each of the first color filters CF1 may transmit light of a blue wavelength band therethrough, and may absorb or block light of each of green and red wavelength bands. Therefore, each of the first color filters CF1 may transmit therethrough a portion of the first light that is emitted from the light emitting element LE and that is not converted into the fourth light by the wavelength conversion layer QDL. The first color filters CF1 may absorb or block the fourth light that is converted from a remaining portion of the first light, which is emitted from the light emitting element LE, by the wavelength conversion layer QDL. Accordingly, each of the first light-emitting areas EA1 may emit the first light.

Each of the second color filters CF2 may be located on the wavelength conversion layer QDL in a respective second light-emitting area EA2. Further, each of the second color filters CF2 may be located on the partitioning wall PW. Each of the second color filter CF2 may transmit second light therethrough, and may absorb or block the first light and the third light. For example, each of the second color filters CF2 may transmit light of a green wavelength band therethrough, and may absorb or block light of each of blue and red wavelength bands. Therefore, each of the second color filters CF2 may absorb or block a portion of the first light emitted from the light emitting element LE that is not converted into the fourth light by the wavelength conversion layer QDL. Further, each of the second color filters CF2 may transmit therethrough the second light corresponding to the green wavelength band, and may block or absorb the fourth light converted from a portion of the first light by the wavelength conversion layer QDL, and may absorb or block the third light corresponding to the red wavelength band. Accordingly, each of the second light-emitting areas EA2 may emit the second light.

Each of the third color filters CF3 may be located on the wavelength conversion layer QDL in a respective third light-emitting area EA3. Further, each of the third color filters CF3 may be located on the partitioning wall PW. Each of the third color filters CF3 may transmit third light therethrough, and may absorb or block the first light and the second light. For example, each of the third color filters CF3 may transmit light of a red wavelength band therethrough, and may absorb or block light of a blue and green wavelength band. Therefore, each of the third color filters CF3 may absorb or block a portion of the first light emitted from the light emitting element LE that is not converted into the fourth light by the wavelength conversion layer QDL. Further, each of the third color filters CF3 may transmit therethrough the third light corresponding to the red wavelength band, and may block or absorb the fourth light converted from a portion of the first light by the wavelength conversion layer QDL, and may absorb or block the second light corresponding to the green wavelength band. Accordingly, each of the third light-emitting areas EA3 may emit the third light.

FIG. 7 to FIG. 17 are cross-sectional views for illustrating a manufacturing method of a display device according to some embodiments.

Figure 7:
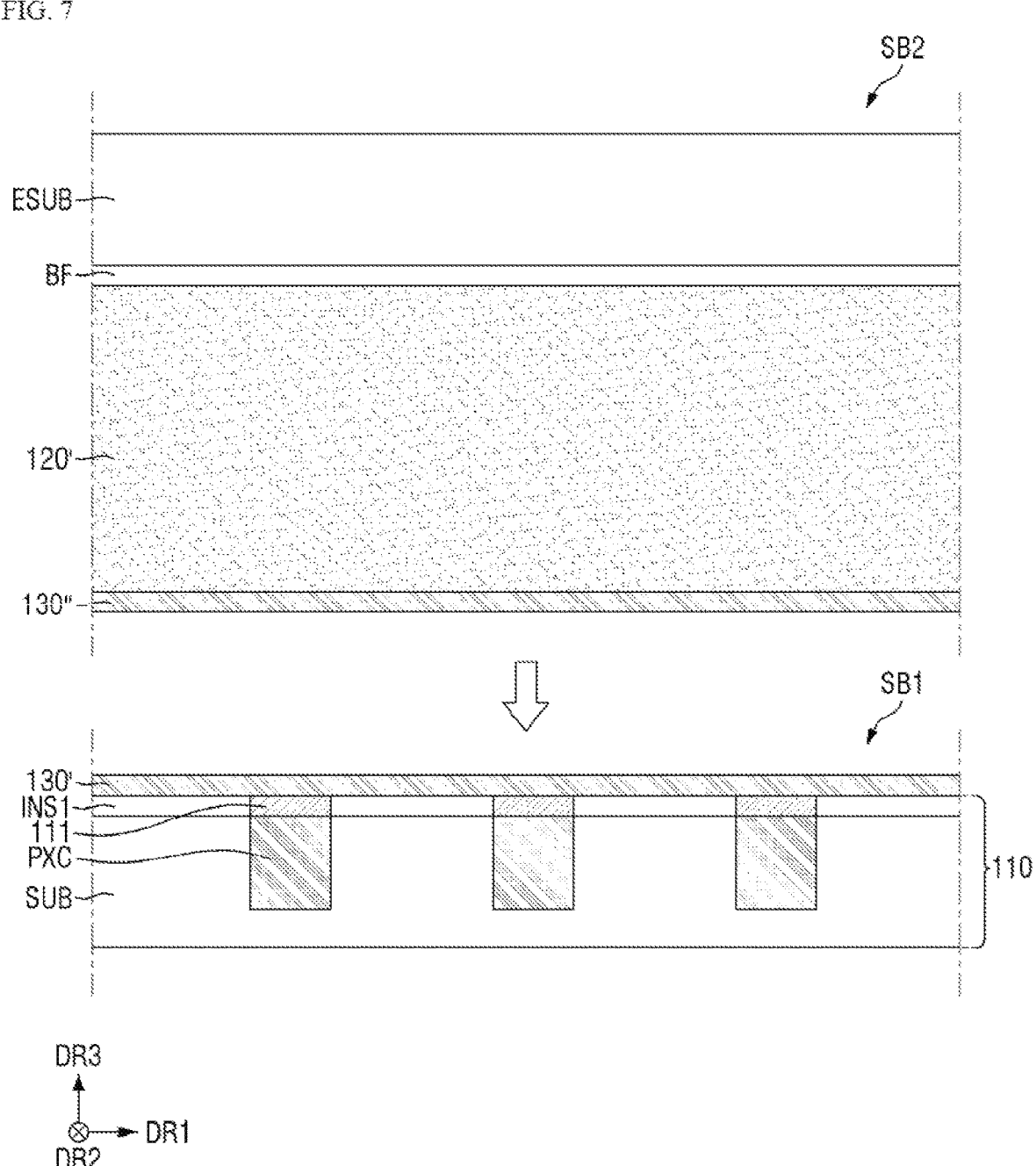
Figure 8:
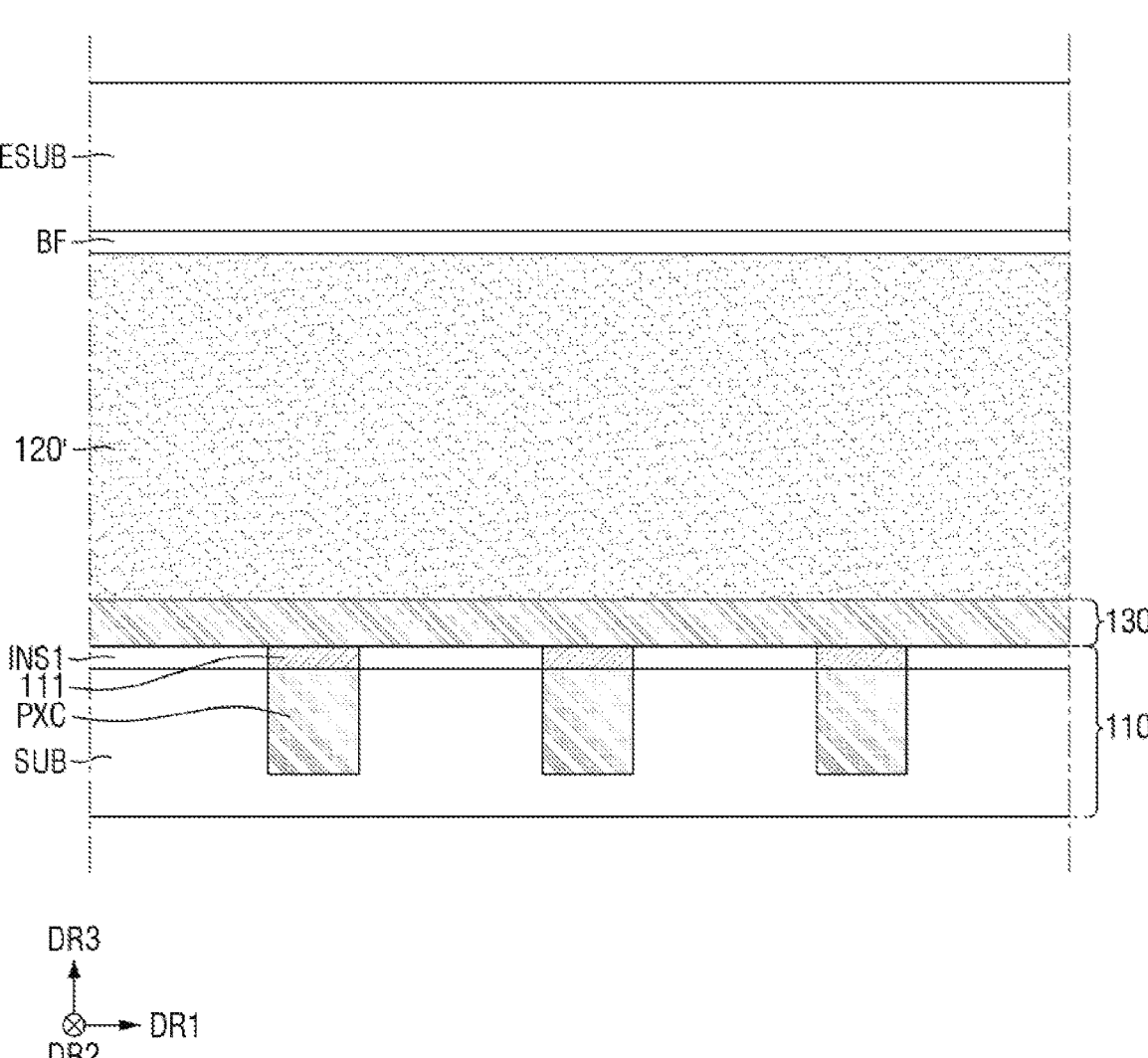

First, referring to FIG. 7 and FIG. 8, the first sub-substrate SB1 and the second sub-substrate SB2, which are initially spaced from each other, may be bonded to each other via a first material layer 130' for a conductive connection layer, and a second material layer 130" for a conductive connection layer.

The first sub-substrate SB1 may include the semiconductor circuit board 110, and the first material layer 130' for the conductive connection layer located on the semiconductor circuit board 110. The second sub-substrate SB2 may include a light emitting element substrate ESUB, and may include a buffer layer BF, a material layer 120' for a light emitting element, and the second material layer 130" for the conductive connection layer that are sequentially located on the light emitting element substrate ESUB. The material layer 120' for the light emitting element may include the first semiconductor layer SEMI, the electron blocking layer EBL, the active layer MQW, the superlattice layer SLT, and the second semiconductor layer SEM2, as shown in FIG. 5.

The first sub-substrate SB1 and the second sub-substrate SB2 may be bonded to each other by bonding the first material layer 130' for the conductive connection layer, and the second material layer 130" for the conductive connection layer to each other. The first material layer 130' for the conductive connection layer and the second material layer 130" for the conductive connection layer may include the same material. The first material layer 130' for the conductive connection layer and the second material layer 130" for the conductive connection layer may include, for example, ITO.

While the first material layer 130' for the conductive connection layer and the second material layer 130" for the conductive connection layer contact each other, the first material layer 130' for the conductive connection layer and the second material layer 130" for the conductive connection layer may be melt-bonded to each other at a temperature (e.g., at a predefined temperature). Accordingly, the first material layer 130' for the conductive connection layer and the second material layer 130" for the conductive connection layer may be bonded to each other to form the conductive connection layer 130.

Figure 9:
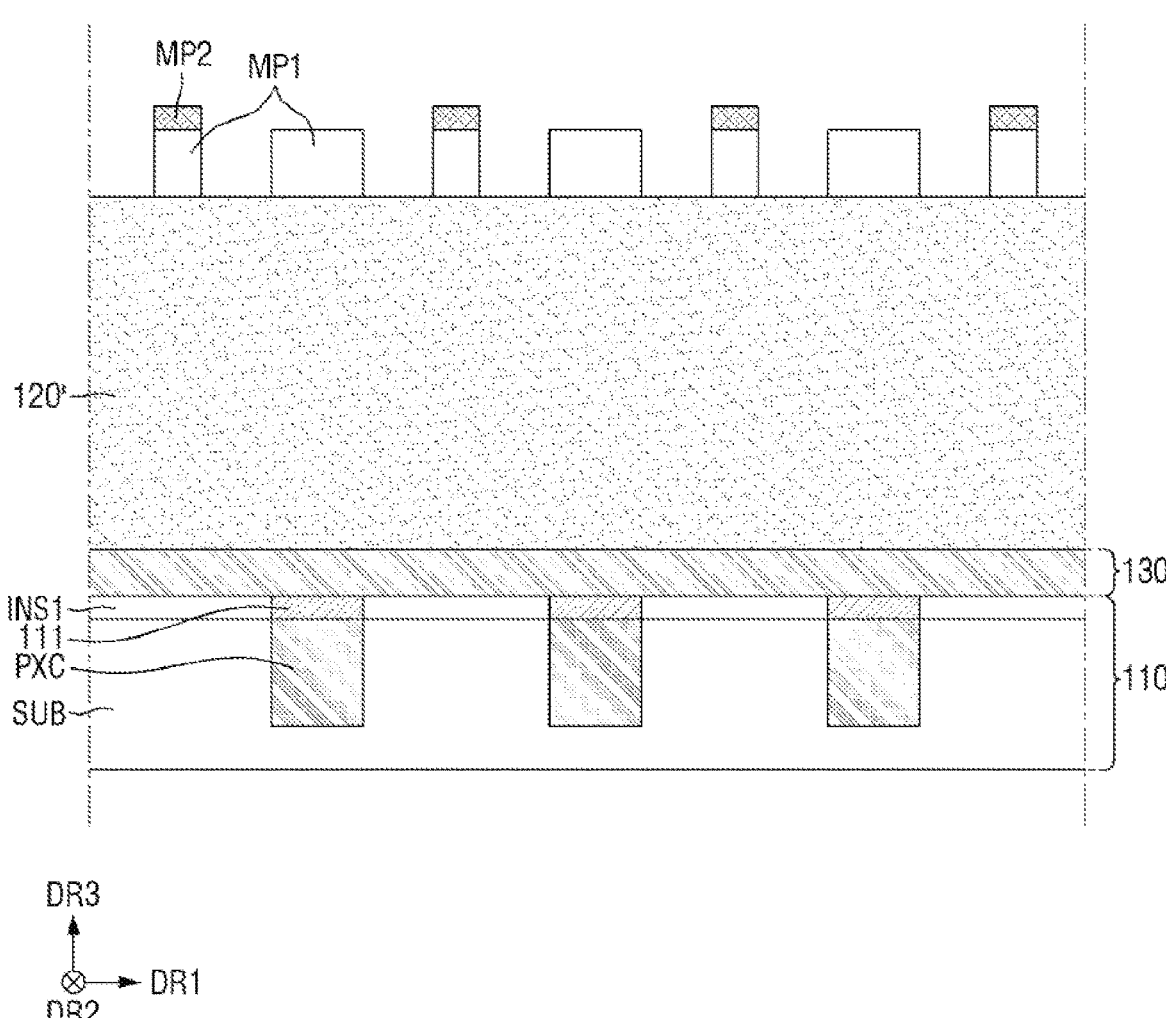

Then, referring to FIG. 9, the buffer layer BF and the light emitting element substrate ESUB are removed. The first mask pattern MP1 and the second mask pattern MP2 are sequentially located on the material layer 120' for the light emitting element.

The first mask pattern MP1 is formed on a top face of the material layer 120' for the light emitting element from which the buffer layer BF and the light emitting element substrate ESUB have been removed. The top face of the material layer 120' for the light emitting element may be exposed upwardly after the light emitting element substrate ESUB and the buffer layer BF are removed. The first mask pattern MP1 may be formed in an area where the first partitioning wall PW1 and the light emitting element LE will be formed subsequently. The first mask pattern MP1 may include an inorganic film such as a silicon oxide film ($SiO_2$ film), an aluminum oxide film ($Al_2O_3$ film), or a hafnium oxide film (HfOx film).

The second mask pattern MP2 may be located on a portion of the first mask pattern MP1. The second mask pattern MP2 may be formed in an area where the partitioning wall PW will be formed subsequently. The second mask pattern MP2 may include a conductive material such as nickel (Ni).

Figure 10:
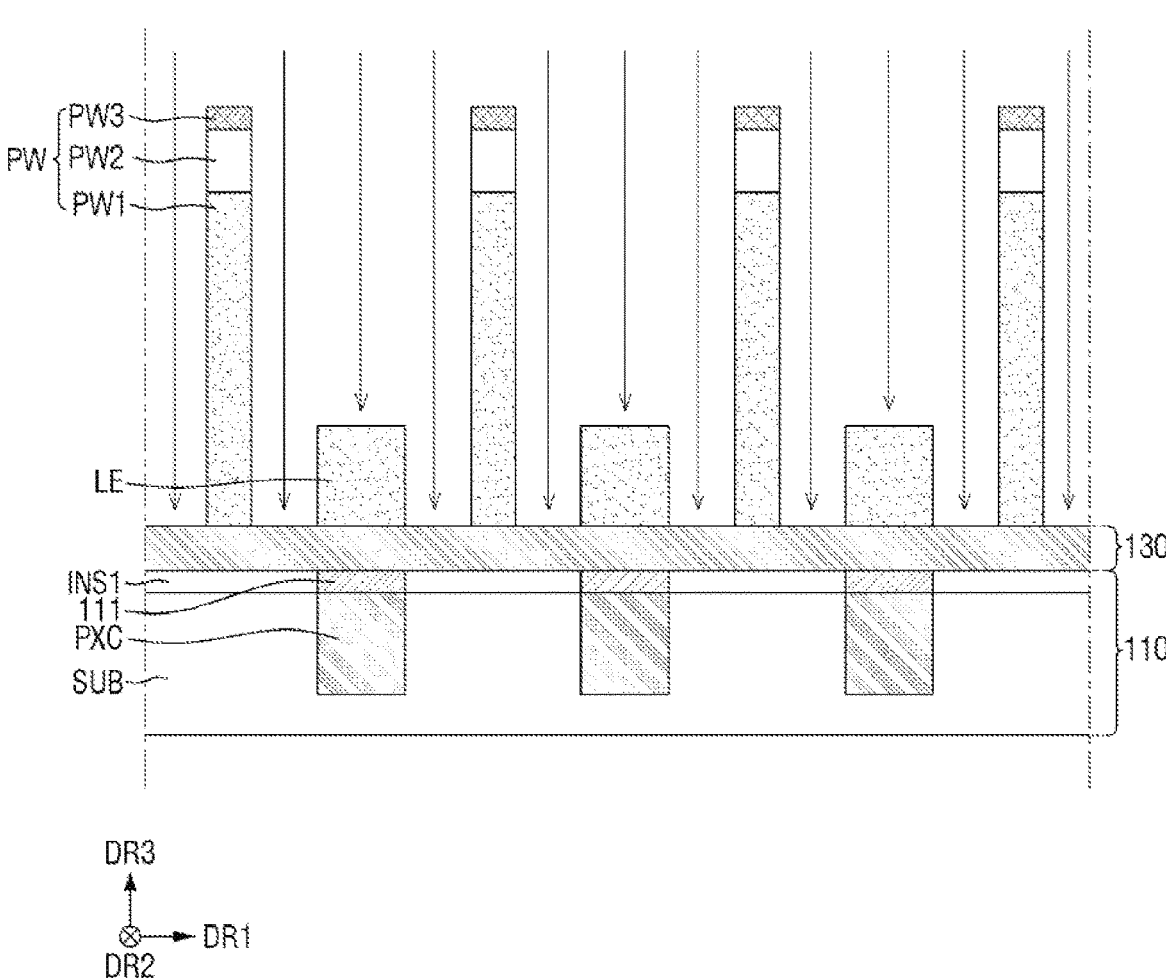

Then, referring to FIG. 10, the material layer 120' for the light emitting element is etched using the first mask pattern MP1 and the second mask pattern MP2 as a mask. The material layer 120' for the light emitting element might not be etched in an area where the first mask pattern MP1 is located, while the material layer 120' for the light emitting element may be removed in an area where the first mask pattern MP1 is not located. Partially etching the material layer 120' for the light emitting element may allow the light emitting element LE and the partitioning wall PW to be formed in the same process.

Referring to FIG. 10, an example in which the light emitting element LE and the partitioning wall PW are formed in the same process is described. The present disclosure is not limited thereto. The light emitting element LE and the partitioning wall PW may be formed in different processes. For example, the first sub-substrate SB1 (see FIG. 7) and the second sub-substrate SB2 (see FIG. 7) may be bonded to each other via the first material layer 130' for the conductive connection layer (see FIG. 7) and the second material layer 130" for the conductive connection layer (see FIG. 7). Then, the material layer 120' for the light emitting element may be partially etched in areas other than the area where the light emitting element LE is located to form the light emitting element LE. Subsequently, the partitioning wall PW may be formed using a separate process. In this case, the partitioning wall PW (or the first partitioning wall PW1) may include a material that is different from that of the light emitting element LE.

Figure 11:
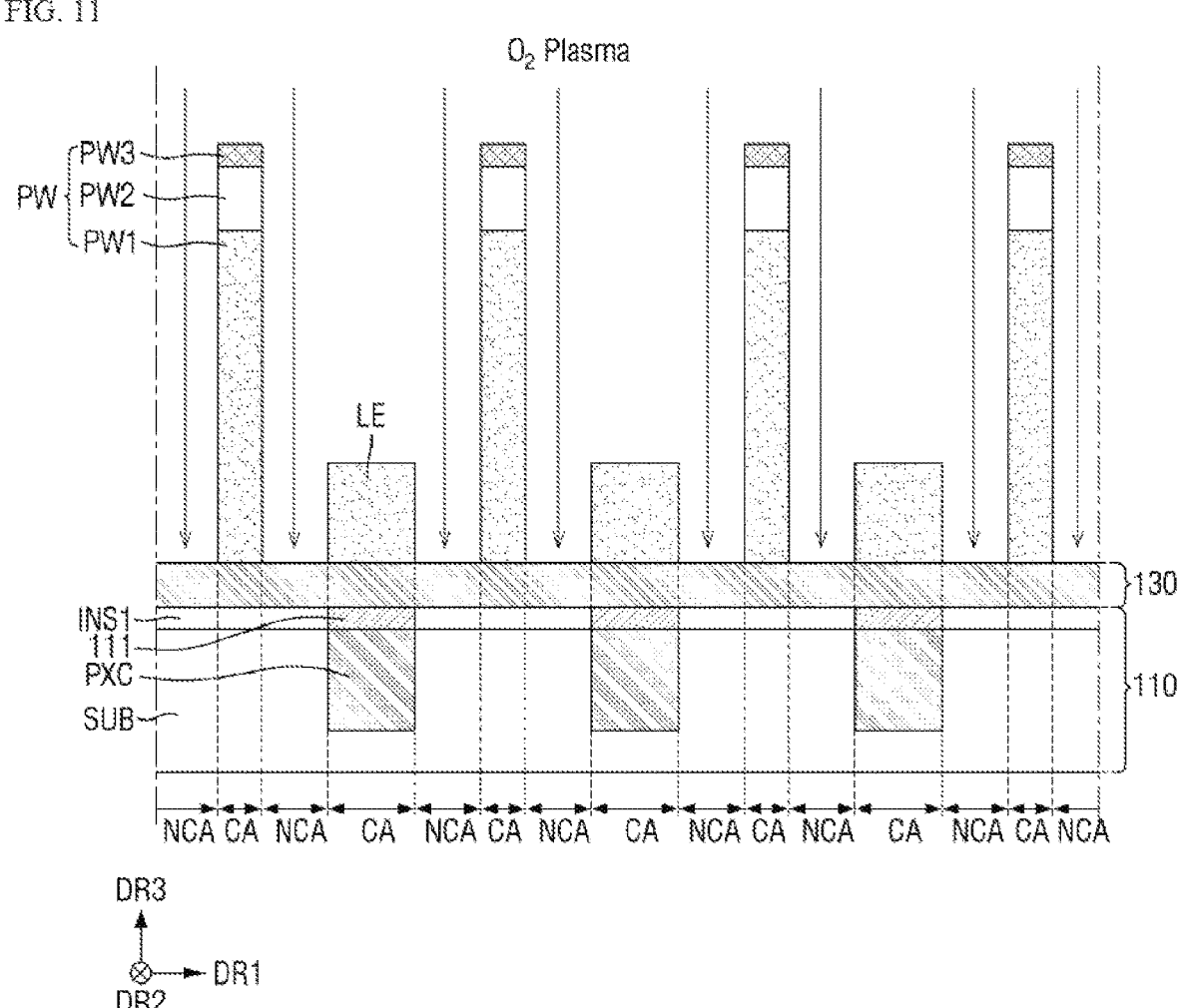

Then, referring to FIG. 11, the material layer 120' for the light emitting element (see FIG. 10) is partially etched, and then, plasma treatment using oxygen (O₂) gas is performed on an exposed portion of the conductive connection layer 130. In this case, the exposed portion of the conductive connection layer 130 not overlapping the light emitting element LE or the partitioning wall PW may be plasma-treated, while a remaining portion of the conductive connection layer 130 covered by the light emitting element LE or the partitioning wall PW might not be plasma-treated. Accordingly, the conductive area CA and the non-conductive area NCA may be formed. The non-conductive area NCA may correspond to the plasma-treated area, and might not overlap the light emitting element LE and the partitioning wall PW, while the conductive area CA may correspond to the non-plasma-treated area, and may overlap the light emitting element LE or the partitioning wall PW.

Due to the plasma treatment, the conductive connection layer 130 may be divided into the areas having different electrical conductivities. Because adjacent ones of the plurality of conductive areas CA are spaced from each other via the non-conductive area NCA, it may not be necessary to etch the conductive connection layer 130 to achieve electrical separation or isolation of an area (e.g., the conductive area CA) for connecting the pixel electrode 111 and the light emitting element LE to each other.

Figure 12:
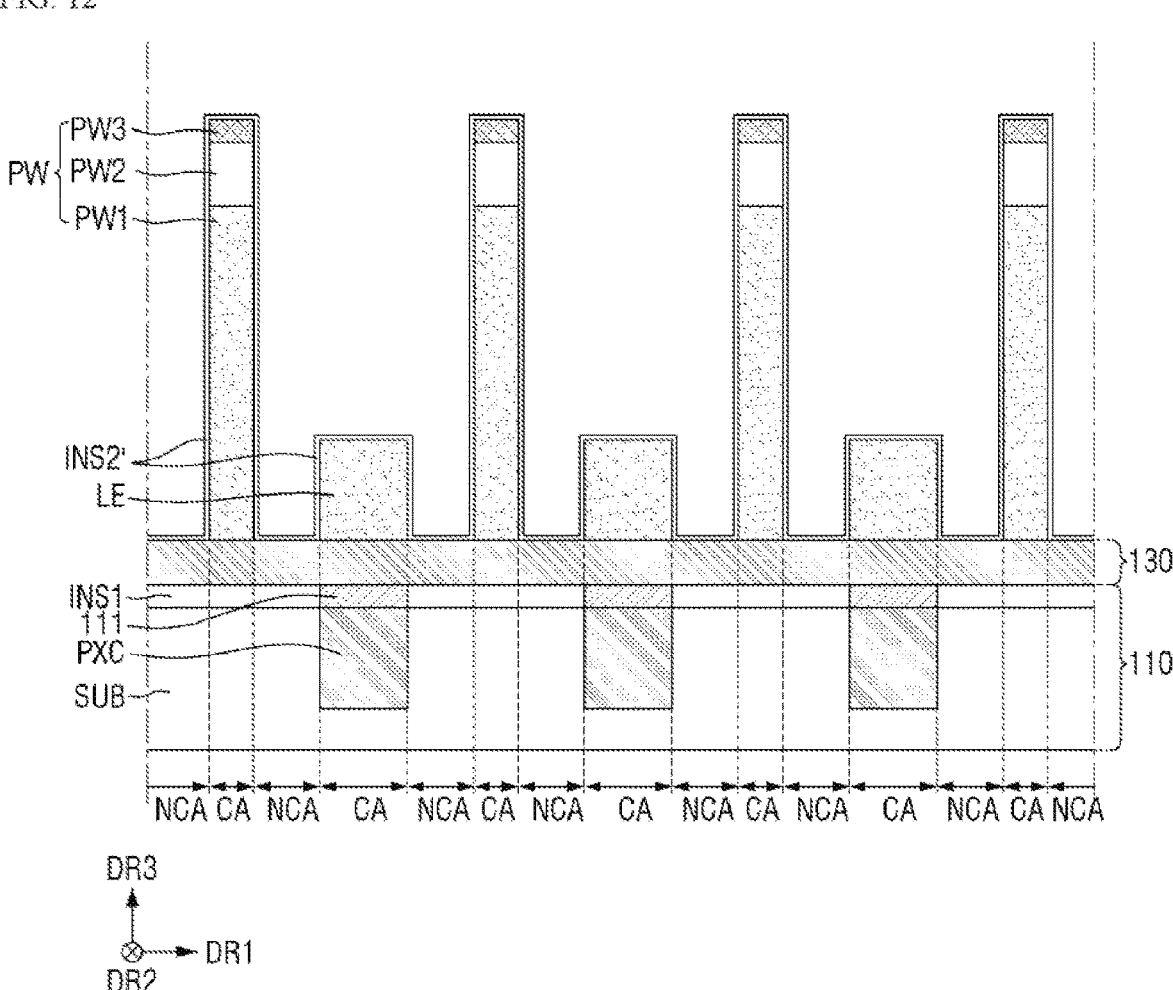
Figure 13:
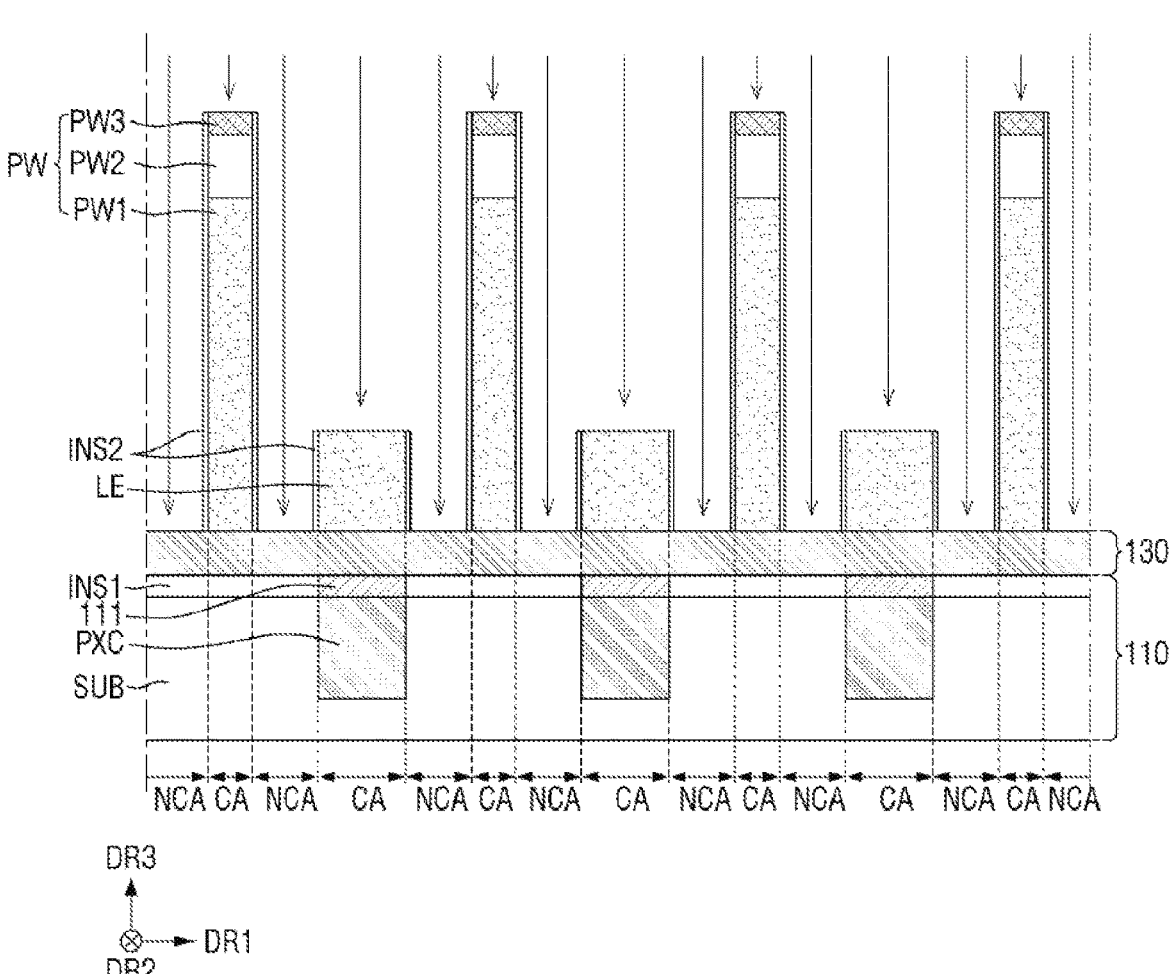

Then, referring to FIG. 12 and FIG. 13, the second insulating film INS2 is formed on the side faces of each of the light emitting element LE and the partitioning wall PW.

First, a material layer INS2' for the second insulating film is deposited on an entire area over the conductive connection layer 130 on which the light emitting element LE and the partitioning wall PW are located. In this case, the material layer INS2' for the second insulating film may be located on the top face of the conductive connection layer 130, on the top face and the side faces of the partitioning wall PW, and on the top face and the side faces of the light emitting element LE.

Then, the material layer INS2' for the second insulating film is partially etched to form the second insulating film INS2. The material layer INS2' for the second insulating film may be etched using etching gas (e.g., predefined etching gas) without a separate mask while generating a relatively large voltage difference in the third direction DR3. In this case, a portion of the material layer INS2' for the second insulating film located on the top face of the conductive connection layer 130, the top face of the partitioning wall PW, and the top face of the light emitting element LE may be removed. Therefore, the second insulating film INS2 may be located on the side faces of the light emitting element LE and on the side faces of the partitioning wall PW. In this case, the second insulating film INS2 may expose the top face of the light emitting element LE, the top face of the partitioning wall PW, and the top face of the non-conductive area NCA of the conductive connection layer 130.

Figure 14:
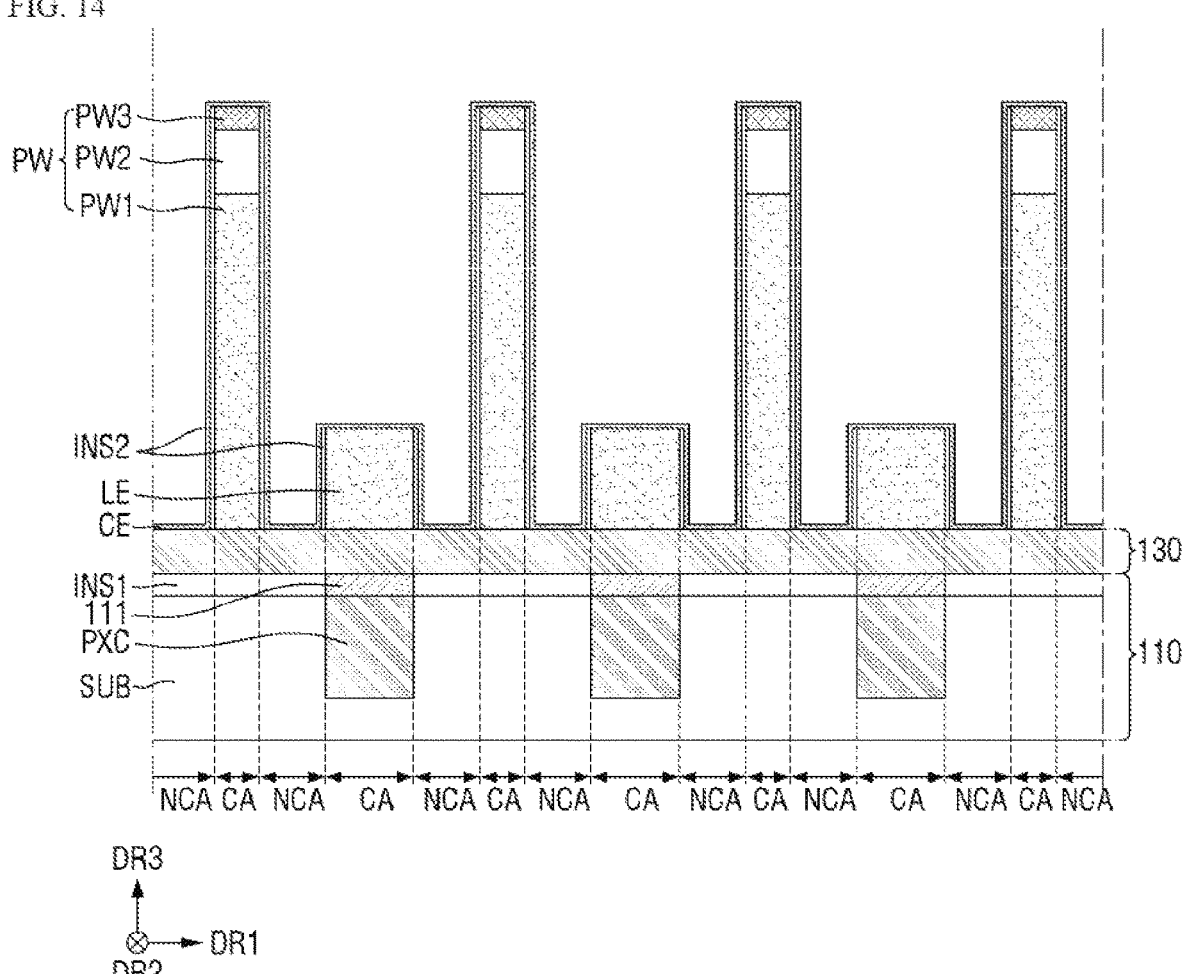

Then, referring to FIG. 14, the common electrode CE is formed on the light emitting element LE. The common electrode CE may be formed over an entire area of the base substrate SUB. In other words, the common electrode CE may be located on the top face of the conductive connection layer 130, the top face and the side faces of the partitioning wall PW, and the top face and the side face of the light emitting element LE, and may be located on the second insulating film INS2. In this case, the common electrode CE may directly contact the top face of the light emitting element LE, the top face of the partitioning wall PW, and the non-conductive area NCA of the conductive connection layer 130. The common electrode CE may be electrically connected to the light emitting element LE.

Figure 15:
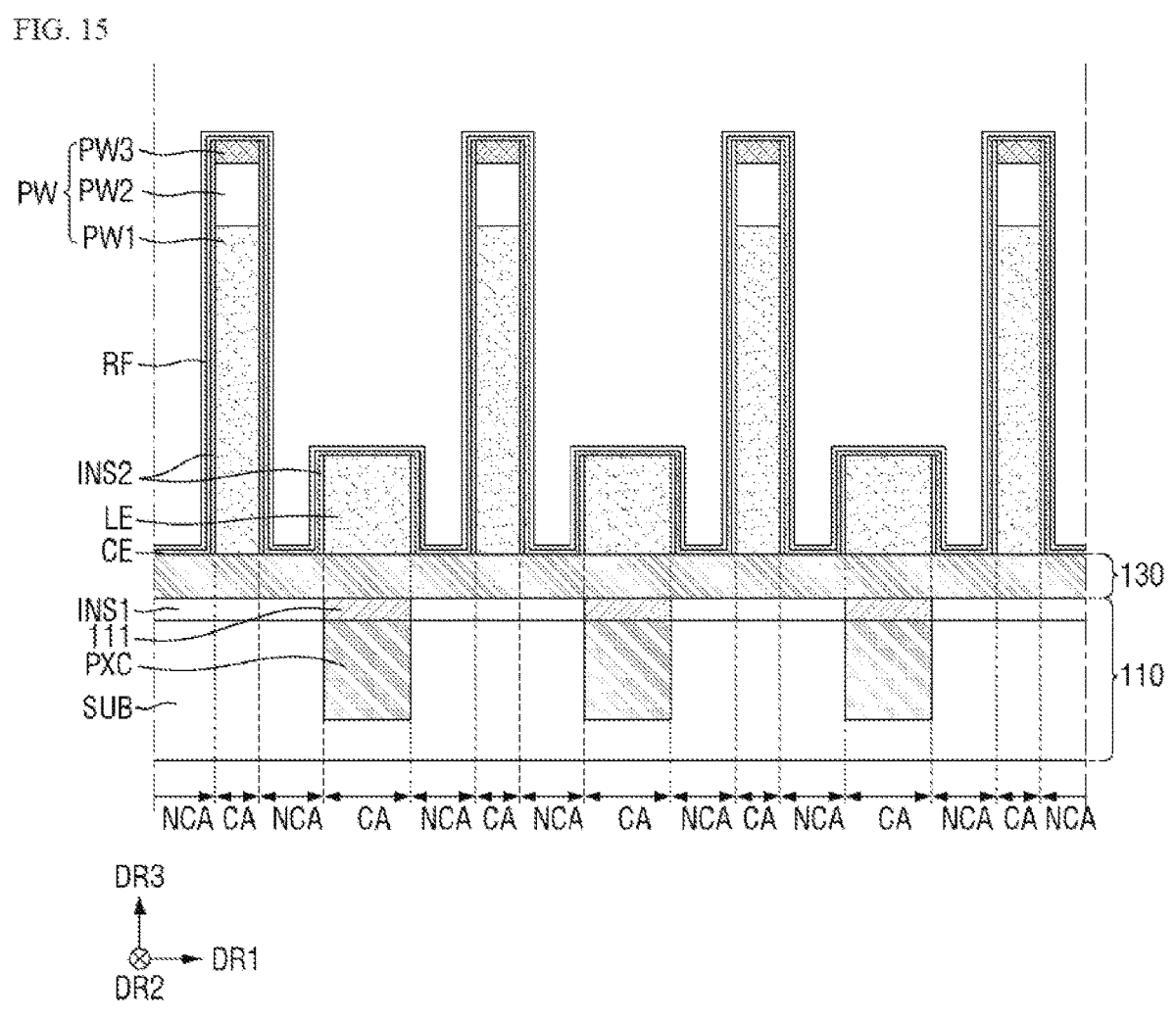
Figure 16:
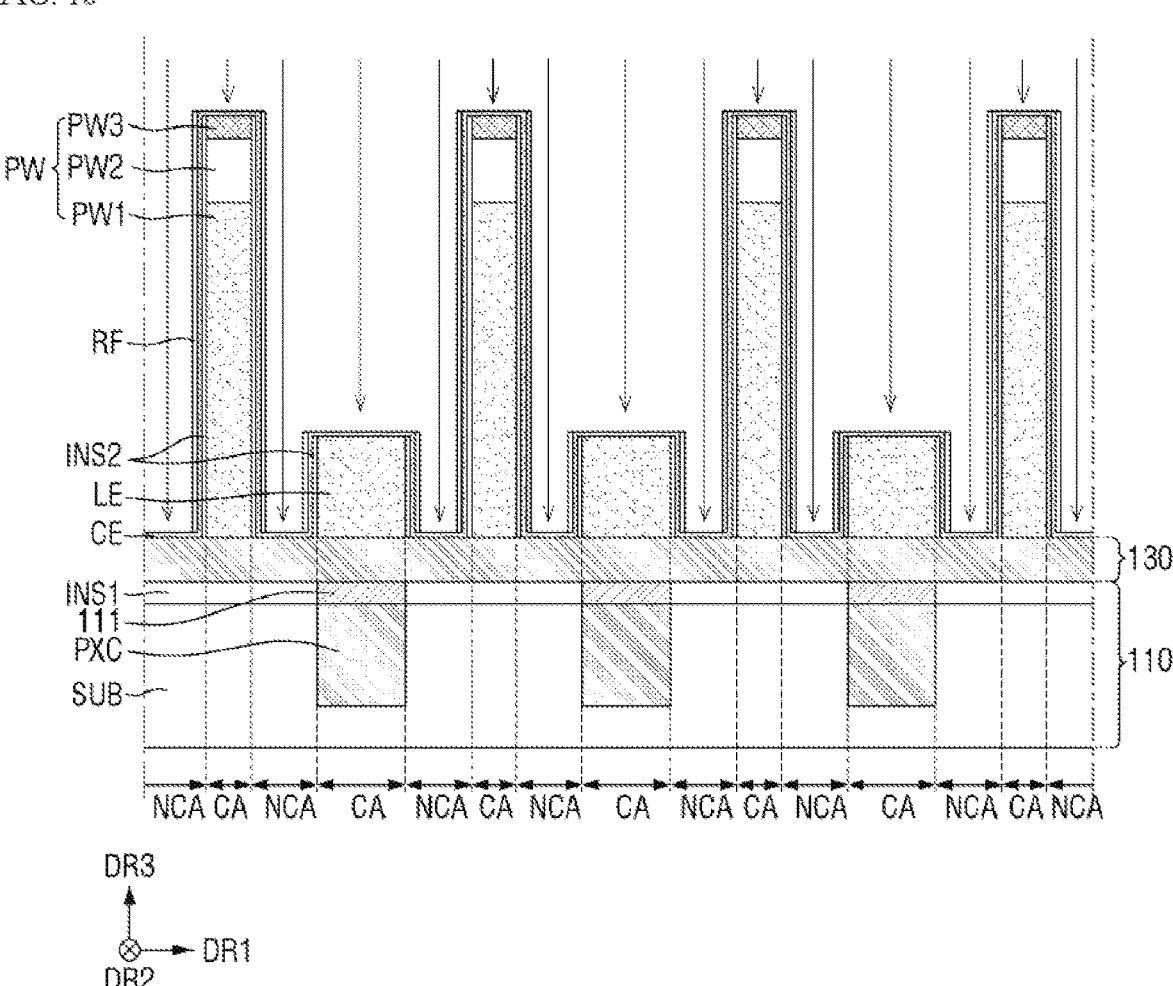

Then, referring to FIG. 15 and FIG. 16, the reflective film RF is formed on the common electrode CE.

First, a material layer RF' for the reflective film is deposited over an entire area of the conductive connection layer 130 on which the light emitting element LE and the partitioning wall PW are located. In this case, the material layer RF' for the reflective film may be located on the common electrode CE. The material layer RF' for the reflective film may be located on the common electrode CE, and may be located on the top face of the conductive connection layer 130, on the top face and the side faces of the partitioning wall PW, and on the top face and the side faces of the light emitting element LE.

Then, the material layer RF' for the reflective film is partially etched to form the reflective film RF. The material layer RF' for the reflective film RF may be etched using an etching gas (e.g., a predefined etching gas) without a separate mask while generating a relatively large voltage difference in the third direction DR3. In this case, a portion of the material layer RF' for the reflective film located on the top face of the conductive connection layer 130, the top face of the partitioning wall PW, and the top face of the light emitting element LE may be removed. Therefore, the reflective film RF may be located on the side faces of the light emitting element LE and the side faces of the partitioning wall PW (e.g., with the second insulating film INS2 and the common electrode CE therebetween). In this case, the reflective film RF may expose a portion of the common electrode CE located on the top face of the light emitting element LE, on the top face of the partitioning wall PW, and on the top face of the non-conductive area NCA of the conductive connection layer 130.

Figure 17:
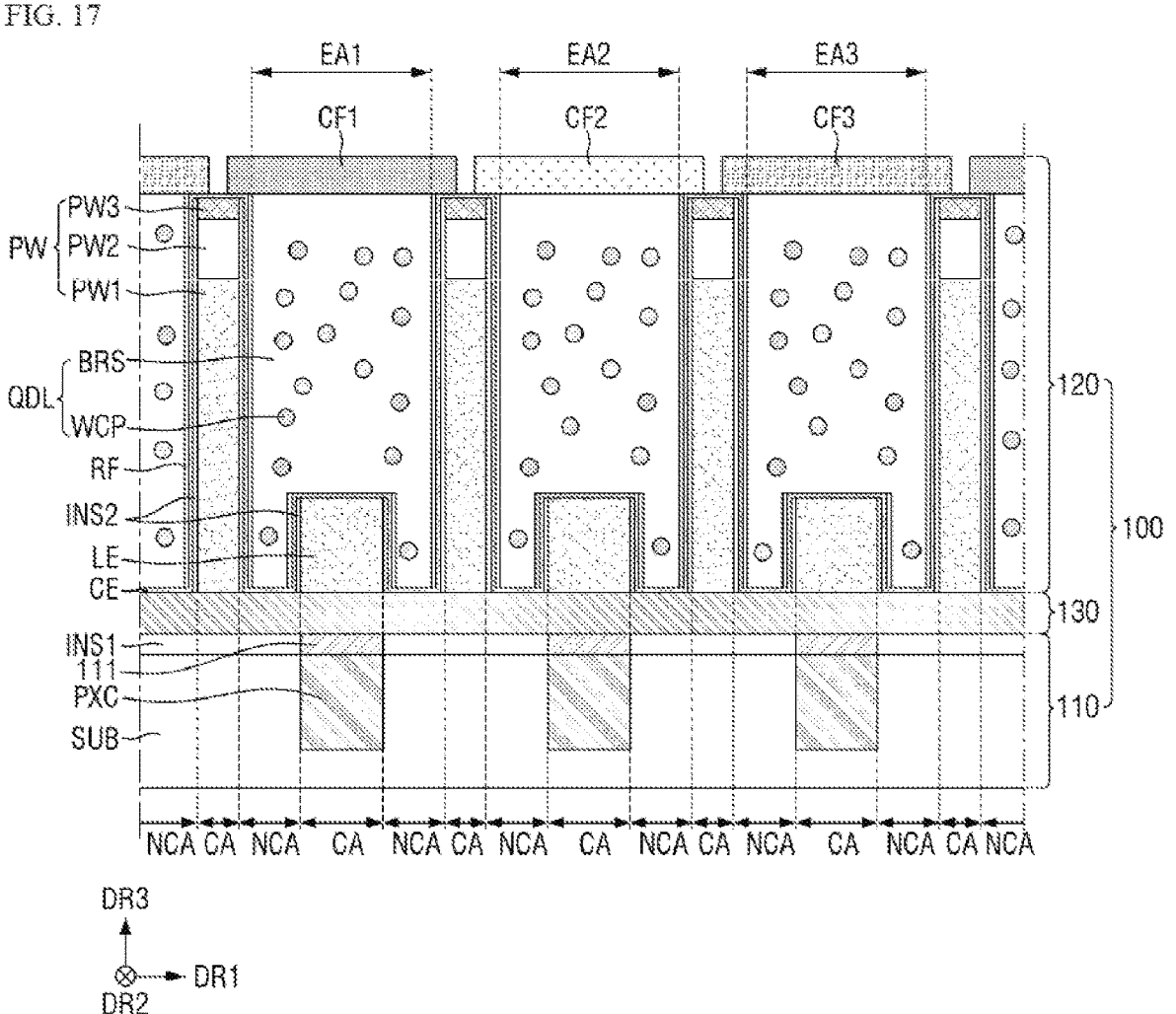

Then, referring to FIG. 17, a space partitioned by the partitioning wall PW is filled with the wavelength conversion layer QDL. The color filters CF1, CF2, and CF3 is located on the wavelength conversion layer QDL. The wavelength conversion layer QDL may be located in each of the light-emitting areas EMA1, EMA2, and EMA3. In this connection, the wavelength conversion layer QDL may fill a portion of an area surrounded by the partitioning wall PW in which the light emitting element LE, the second insulating film INS2, the common electrode CE, and the reflective film RF are absent. Each of the color filters CF1, CF2, and CF3 may be formed on respective ones of the wavelength conversion layer QDL and the partitioning wall PW.

Hereinafter, an application example of the display device 10 according to some embodiments will be described with reference to FIG. 18 to FIG. 21. However, the application example of the display device 10 is not limited thereto.

Figure 18:
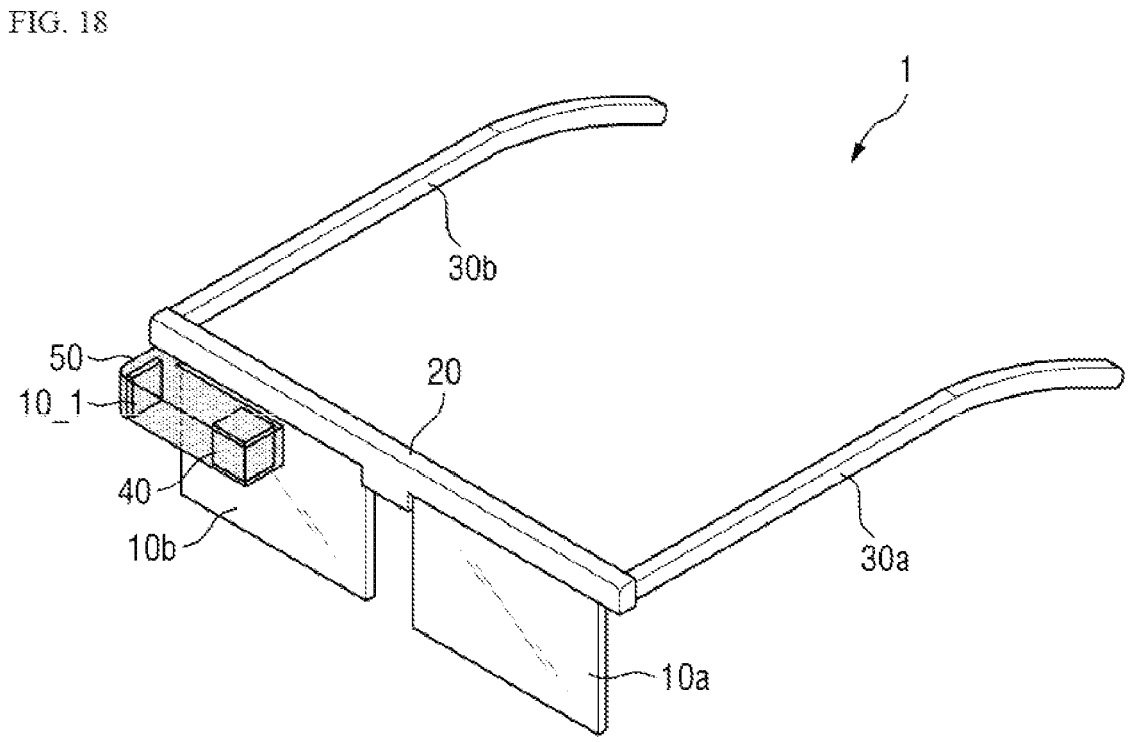
FIG. 18 is an example diagram showing a virtual reality device including a display device according to some embodiments.

FIG. 18 is an example diagram showing a virtual reality device including a display device according to some embodiments. FIG. 18 shows a virtual reality device 1 to which a display device 10_1 according to some embodiments is applied.

Referring to FIG. 18, the virtual reality device 1 according to some embodiments may be a device in a form of glasses. The virtual reality device 1 according to some embodiments may include a display device 10_1, a left-eye lens 10a, a right-eye lens 10b, a support frame 20, left and right legs 30a and 30b, a reflective member 40, and a display device housing 50.

FIG. 18 depicts the virtual reality device 1 as including the two legs 30a and 30b. The present disclosure is not limited thereto. The virtual reality device 1 according to some embodiments may be applied to a head mounted display including a head mounted band that may be mounted on a head instead of the legs 30a and 30b. That is, the virtual reality device 1 according to some embodiments may not be limited to the example shown in FIG. 18, and may be applied in various forms and in various electronic devices.

The display device housing 50 may receive the display device 10_1 and the reflective member 40. An image displayed on the display device 10_1 may be reflected from the reflective member 40, and provided to a user's right-eye through the right-eye lens 10b. Thus, the user may view a virtual reality image displayed on the display device 10_1 via the right-eye.

FIG. 18 illustrates that the display device housing 50 is located at a right end of the support frame 20. However, the present disclosure is not limited thereto. For example, the display device housing 50 may be located at a left end of the support frame 20. In this case, the image displayed on the display device 10_1 may be reflected from the reflective member 40 and provided to the user's left-eye via the left-eye lens 10a. Thus, the user may view the virtual reality image displayed on the display device 10_1 via the left-eye. Alternatively, the display device housing 50 may be located at each of the left end and the right end of the support frame 20. In this case, the user may view the virtual reality image displayed on the display device 10_1 via both the left-eye and the right-eye.

Figure 19:
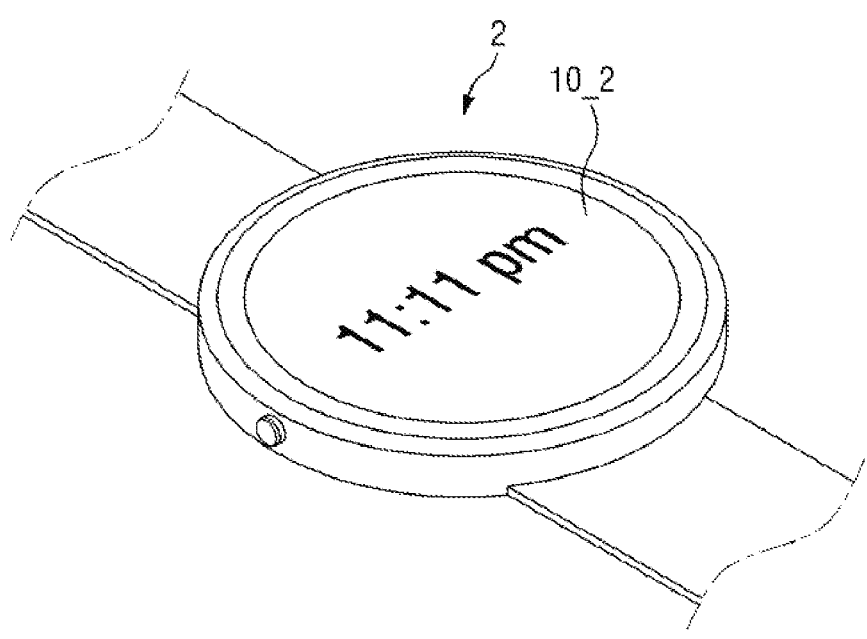
FIG. 19 is an example diagram showing a smart device including a display device according to some embodiments.

FIG. 19 is an example diagram showing a smart device including a display device according to some embodiments.

Referring to FIG. 19, a display device 10_2 according to some embodiments may be applied to a smart watch 2 as one of smart devices.

Figure 20:
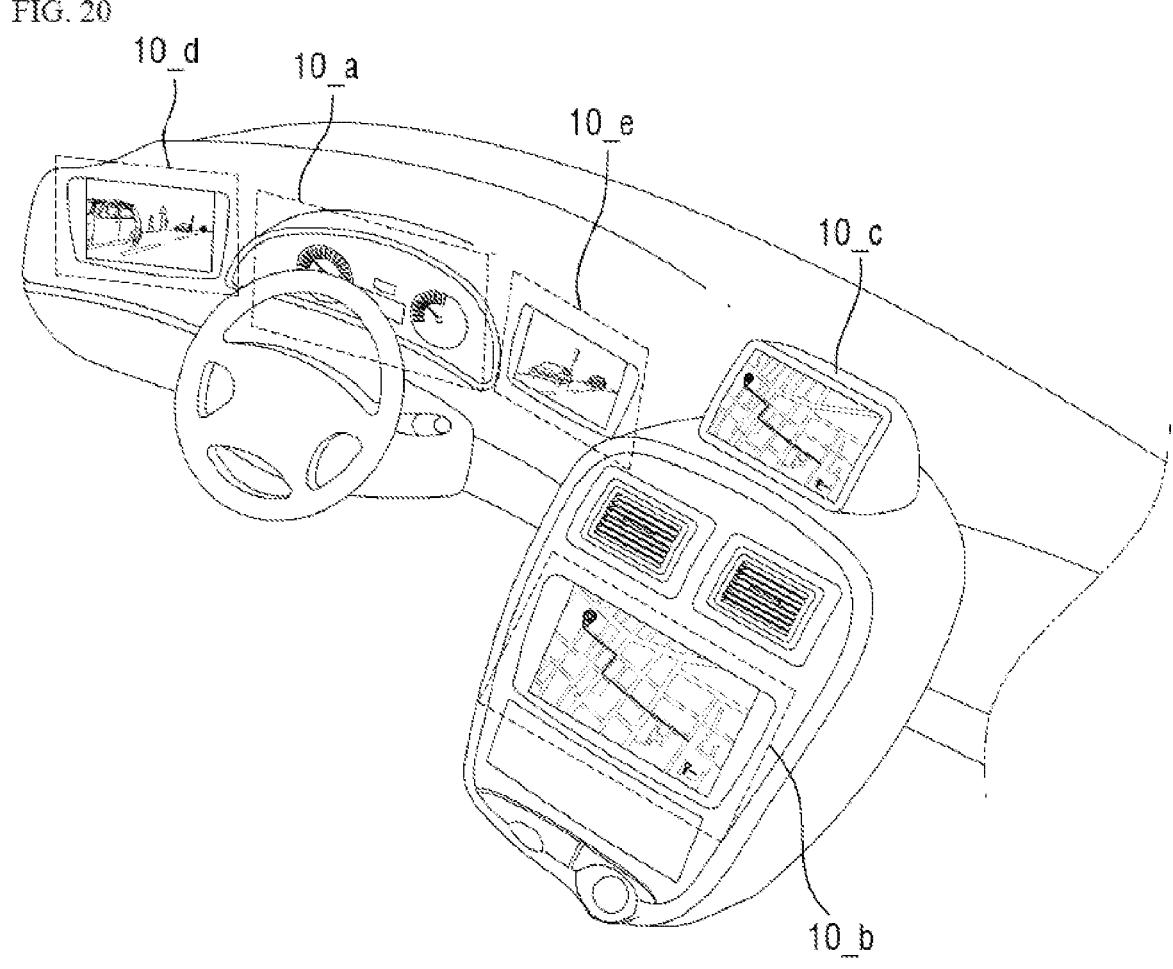
FIG. 20 is a diagram showing a dashboard and a center fascia of a vehicle, each including a display device according to some embodiments.

FIG. 20 is a diagram showing a vehicle dashboard and a center fascia, each including a display device according to some embodiments. FIG. 20 shows a vehicle to which display devices 10_a, 10_b, 10_c, 10_d, and 10_e according to some embodiments are applied.

Referring to FIG. 20, the display devices 10_a, 10_b, and 10_c according to some embodiments may be applied to the dashboard of the vehicle, applied to the center fascia of the vehicle, or applied to a CID (Center Information Display) located on the dashboard of the vehicle. Further, each of the display devices 10_d and 10_e according to some embodiments may be applied to each room mirror display that replaces each of side mirrors of the vehicle.

Figure 21:
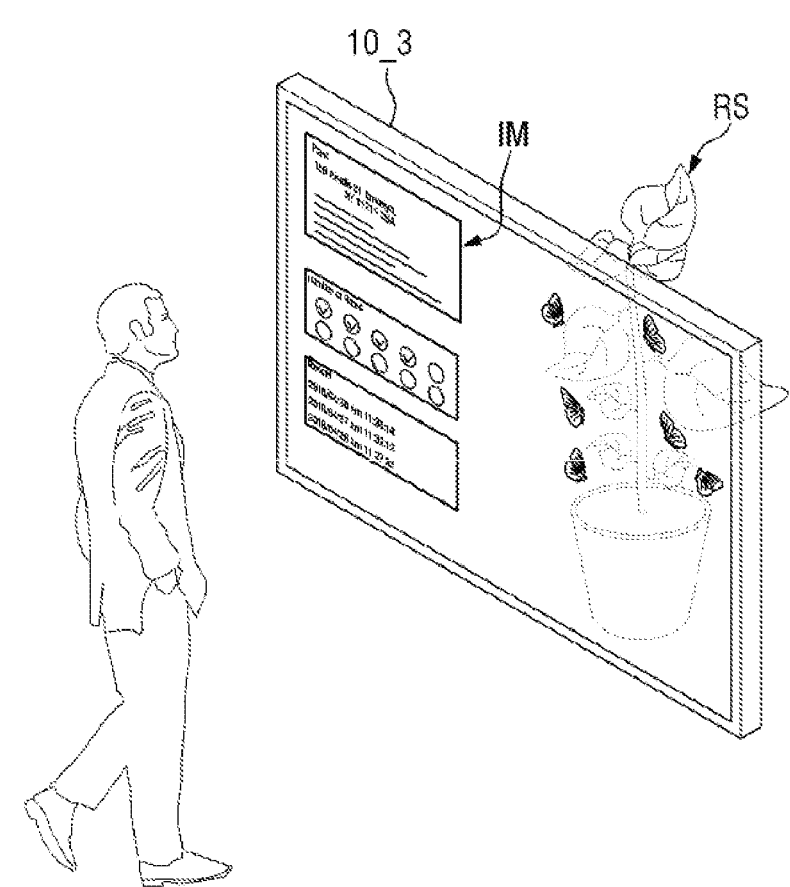
FIG. 21 is one example diagram showing a transparent display device including a display device according to some embodiments.

FIG. 21 is one example diagram showing a transparent display device including a display device according to some embodiments.

Referring to FIG. 21, a display device 10_3 according to some embodiments may be applied to a transparent display device. The transparent display device may transmit light therethrough while displaying an image IM thereon. Therefore, a user located in front of the transparent display device may view not only the image IM displayed on the display device 10_3, but may also see an object RS or a background located behind a rear of the transparent display device. When the display device 10_3 is applied to the transparent display device, a first substrate SUB1 of the display device 10_3 shown in FIG. 4 and FIG. 5 may include a light transmitting portion that may transmit light therethrough, or may be made of a material that may transmit light therethrough.

Hereinafter, other embodiments will be described. In following embodiments, the description of the same configurations as those of the already described embodiments will be omitted or simplified. Following descriptions will be focused on differences therebetween.

Figure 22:
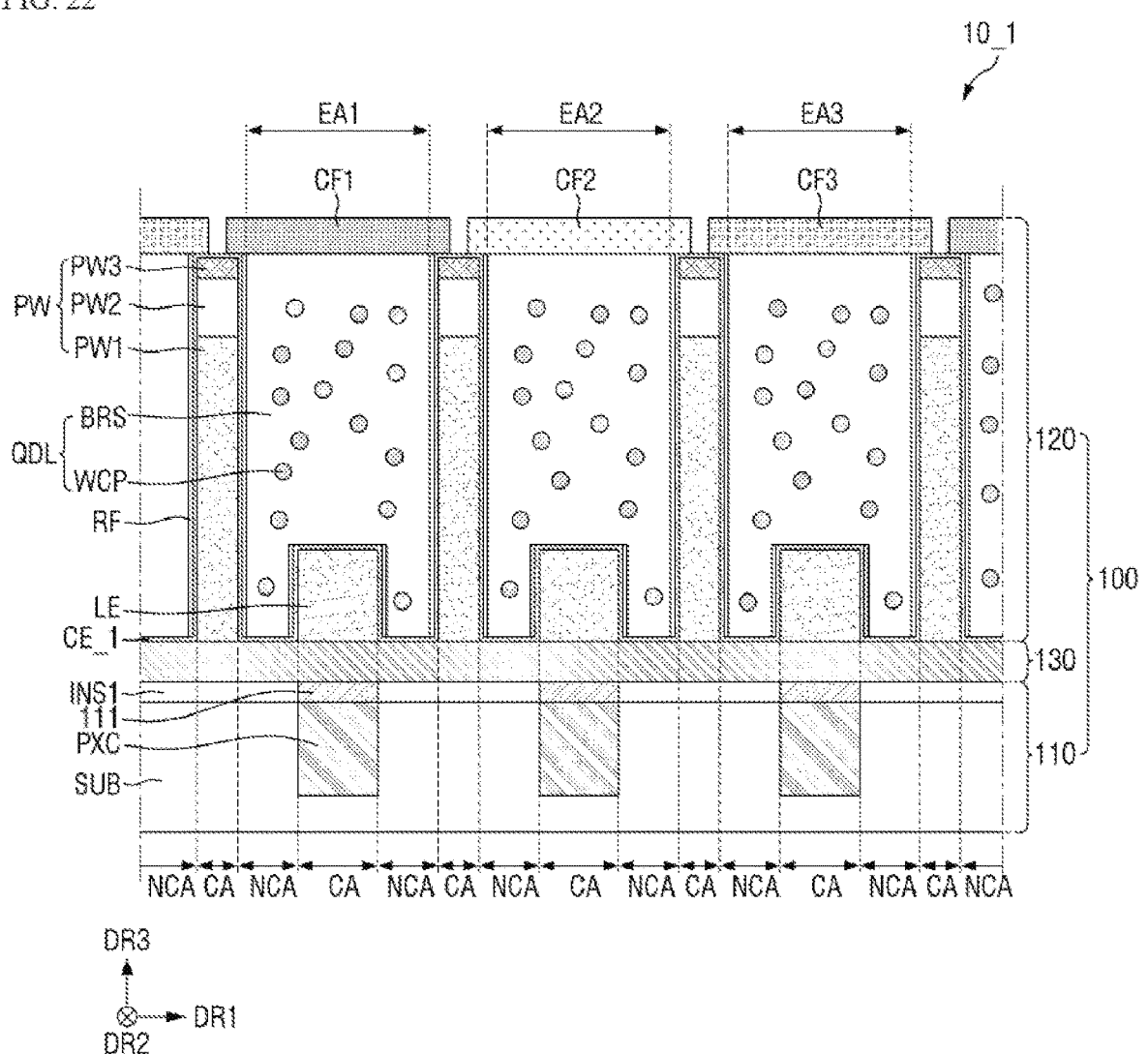
FIG. 22 is a cross-sectional view of a display device according to other embodiments.

FIG. 22 is a cross-sectional view of a display device according to other embodiments.

Referring to FIG. 22, a display device 10_1 according to some embodiments is different from that of the embodiments of FIG. 4 in that the second insulating film INS2 (FIG. 4) is omitted. In this case, a common electrode CE_1 may be in direct contact with the side face of the light emitting element LE, and may directly contact the side face of the partitioning wall PW. The common electrode CE_1 may be in direct contact with a side face of the first partitioning wall PW1, a side face of the second partitioning wall PW2, and a side face of the third partitioning wall PW3. Although the common electrode CE_1 is in direct contact with the partitioning wall PW, the partitioning wall PW and the light emitting element LE may be insulated from each other via the non-conductive area NCA.

In this case, etching of the conductive connection layer 130 is unnecessary, thereby suppressing or preventing defects that may otherwise occur when the etching of the conductive connection layer 130 is performed. In addition, omitting the second insulating film INS2 (refer to FIG. 4) may allow a manufacturing cost of the device to be reduced, and a process efficiency to be improved.

However, the aspects of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:

a base substrate;

a conductive connection layer on the base substrate;

a partitioning wall comprising stacked layers on the conductive connection layer;

a light emitting element comprising stacked layers comprising a first semiconductor layer, an electron-blocking layer, an active layer, a superlattice layer, and a second semiconductor layer on the conductive connection layer and in a space surrounded by the partitioning wall in a plan view, the stacked layers of the light emitting element respectively comprising a same material as, and at a same layer as, the stacked layers of the partitioning wall;

an insulating film on a side surface of the light emitting element;

a reflective film on the insulating film; and a common electrode on the light emitting element and between the insulating film and the reflective film, wherein the conductive connection layer comprises a first portion overlapping the partitioning wall and the light emitting element, and a second portion not overlapping the partitioning wall and the light emitting element, an electrical conductivity of the first portion being greater than an electrical conductivity of the second portion, and wherein the common electrode is in direct contact with the second portion of the conductive connection layer.

2. The display device of claim 1, further comprising a pixel electrode between the base substrate and the light emitting element, and overlapping the first portion of the conductive connection layer, wherein the light emitting element is between the pixel electrode and the common electrode.

3. The display device of claim 1, wherein the common electrode is in direct contact with a side of the partitioning wall.

4. The display device of claim 1, wherein the first portion of the conductive connection layer overlapping the light emitting element is surrounded by the second portion of the conductive connection layer in a plan view.

5. The display device of claim 4, wherein the second portion of the conductive connection layer is surrounded by the first portion of the conductive connection layer overlapping the partitioning wall.

6. The display device of claim 5, wherein the first portion of the conductive connection layer comprises mutually-spaced first portions respectively overlapping light emitting elements, wherein the second portion of the conductive connection layer comprises mutually-spaced second portions, and wherein the first portion of the conductive connection layer overlapping partitioning walls is continuous.

7. The display device of claim 1, wherein the conductive connection layer comprises indium tin oxide (ITO).

8. The display device of claim 1, wherein an oxygen content of the first portion of the conductive connection layer is lower than an oxygen content of the second portion of the conductive connection layer.

9. The display device of claim 1, wherein a surface roughness of the first portion of the conductive connection layer is greater than a surface roughness of the second portion of the conductive connection layer.

10. The display device of claim 1, wherein the first portion of the conductive connection layer is conductive, while the second portion of the conductive connection layer is non-conductive.

11. The display device of claim 1, further comprising a wavelength conversion layer on the light emitting element, and filling a space surrounded by the partitioning wall.

12. The display device of claim 1, wherein the stacked layers of the partitioning wall comprises a sub-partitioning wall comprising a same material as the second semiconductor layer of the stacked layers of the light emitting element, and wherein a thickness of the sub-partitioning wall is greater than a thickness of the second semiconductor layer.

13. A display device comprising:

a base substrate;

a conductive connection layer on the base substrate, and comprising a first portion, and a second portion surrounding the first portion in a plan view, and having an electrical resistance that is higher than the first portion;

a partitioning wall comprising stacked layers on the conductive connection layer;

a light emitting element comprising stacked layers comprising a first semiconductor layer, an electron-blocking layer, an active layer, a superlattice layer, and a second semiconductor layer on the first portion of the conductive connection layer, the stacked layers of the light emitting element respectively comprising a same material as, and at a same layer as, the stacked layers of the partitioning wall;

an insulating film on a side surface of the light emitting element;

a reflective film on the insulating film; and a common electrode on the light emitting element and between the insulating film and the reflective film, wherein the common electrode is in direct contact with the second portion of the conductive connection layer.

14. The display device of claim 13, further comprising a pixel electrode between the base substrate and the light emitting element, and overlapping the first portion of the conductive connection layer, wherein the light emitting element is between the pixel electrode and the common electrode.

15. The display device of claim 13, wherein the conductive connection layer comprises indium tin oxide (ITO).

16. The display device of claim 13, wherein an oxygen content of the first portion of the conductive connection layer is lower than an oxygen content of the second portion of the conductive connection layer.

17. The display device of claim 13, wherein a surface roughness of the first portion of the conductive connection layer is greater than a surface roughness of the second portion of the conductive connection layer.

18. The display device of claim 13, wherein the stacked layers of the partitioning wall comprises a sub-partitioning wall comprising a same material as the second semiconductor layer of the stacked layers of the light emitting element, and wherein a thickness of the sub-partitioning wall is greater than a thickness of the second semiconductor layer.

* * * * *